(12) United States Patent
Patil et al.

(10) Patent No.: US 11,218,158 B1
(45) Date of Patent: Jan. 4, 2022

(54) DIGITAL ESTIMATION OF TRANSFER FUNCTIONS IN CONTINUOUS-TIME ANALOG-TO-DIGITAL CONVERTERS

(71) Applicant: Analog Devices International Unlimited Company, Limerick (IE)

(72) Inventors: Sharvil Pradeep Patil, Toronto (CA); Donald W. Paterson, Winchester, MA (US); Prawal Man Shrestha, San Diego, CA (US); Asha Ganesan, Toronto (CA); Yue Yin, Woodbridge (CA); Zhao Li, Toronto (CA); Victor Kozlov, Toronto (CA); Hajime Shibata, Toronto (CA)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/154,138

(22) Filed: Jan. 21, 2021

(51) Int. Cl.
*H03M 1/10* (2006.01)
*H03M 1/16* (2006.01)
*H03M 1/14* (2006.01)

(52) U.S. Cl.
CPC ......... *H03M 1/1071* (2013.01); *H03M 1/164* (2013.01); *H03M 1/145* (2013.01); *H03M 1/167* (2013.01)

(58) Field of Classification Search
CPC .... H03M 1/1071; H03M 1/145; H03M 1/164; H03M 1/167; H03M 1/44; H03M 1/1009

USPC .......................................... 341/120, 143, 161
See application file for complete search history.

(56) References Cited

U.S. PATENT DOCUMENTS

| | | | |
|---|---|---|---|
| 7,301,489 B2 | 11/2007 | Lin | |
| 8,896,475 B2 | 11/2014 | Shibata | |
| 9,614,510 B2 * | 4/2017 | Srinivasan | H03M 3/386 |
| 9,768,793 B2 | 9/2017 | Meng et al. | |
| 9,838,031 B2 | 12/2017 | Dong et al. | |
| 10,432,210 B1 * | 10/2019 | Yendluri | H03M 1/466 |

OTHER PUBLICATIONS

Shibata et al., *A 9GS/s 1GHz-BW Oversampled Continuous-Time Pipeline ADC Achieving—161dBFS/Hz NSD*, Isscc 2017, Session 16, Gigahertz Data Converters, 16.2, 3 pages.

(Continued)

*Primary Examiner* — Khai M Nguyen
(74) *Attorney, Agent, or Firm* — Patent Capital Group

(57) ABSTRACT

In one aspect, a transfer function (TF) estimation circuit configured to generate an estimate of a TF undergone by signals between an input of a digital-to-analog converter (DAC) of a feedforward path of a continuous-time (CT) stage of an analog-to-digital converter (ADC) and an output of a backend ADC of the ADC is disclosed. The TF estimation circuit includes one or more circuits configured to generate a first cross-correlation output by cross-correlating digital versions of signals based on a test signal provided to the CT stage and an output signal of the backend ADC, generate a second cross-correlation output by cross-correlating digital versions of signals based on the test signal and an output signal of a quantizer of the feedforward path of the CT stage, and generate the estimate of the TF based on the first and second cross-correlation outputs.

20 Claims, 10 Drawing Sheets

(56) References Cited

OTHER PUBLICATIONS

Dong et al., *A Continuous-Time 0-3 MASH ADC Achieving 88 dB DR with 53 MHz BW in 28 nm CMOS*, IEEE Journal of Solid-State Circuits, vol. 49, No. 12, Dec. 2014, 10 pages.

Dong et al., *A 72 dB-DR 465 MHz-BW Continuous-Time 1-2 MASH ADC in 28 nm CMOS*, IEEE Journal of Solid-State Circuits, vol. 51, No. 12, Dec. 2016, 11 pages.

Dong et al., *Adaptive Digital Noise-Cancellation Filtering using Cross-Correlators for Continuous-Time MASH ADC in 28 nm CMOS*, 978-1-5090-5191-5/17, 2017 IEEE, 4 pages.

Shibata et al., *An 800MHz-BW VCO-Based Continuous-Time Pipelined ADC with Inherent Anti-Aliasing and On-Chip Digital Reconstruction Filter*, ISSCC 2020, Session 16, Nyquist & VCO-based ADCs, 16.6, 3 pages.

Reddy et al., *A 16-mW 78-dB SNDR 10-MHz BW CT $\Delta\Sigma$ ADC Using Residue-Cancelling VCO-Based Quantizer*, IEEE Journal of Solid-State Circuits, vol. 47, No. 12, Dec. 2012, 12 pages.

Saxena et al., *Reconfigurable Continuous-Time Delta-Sigma Analog-to-Digital Converters for Software-Defined and Multi-Standard Radios*, Proceedings of the SDR 11 Technical Conference and Product Exposition, © 2011 Wireless Innovation Forum. 10 pages.

Taylor et al., *A Mostly Digital Variable-Rate Continuous-Time ADC $\Delta\Sigma$ Modulator*, 2010 IEEE International Solid State Circuits Conference, 12 pages.

Barangi et al., *A Continuous-Time Sigma-Delta ADC with Tunable Pass-Band for Multi-Standard Applications*, 978-1-4799-0066-4/13, © 2013 IEEE, 4 pages.

Tan et al., *A Continuous-Time Delta-Sigma ADC with Integrated Digital Background Calibration*, Analog Integr Circ Sig Process (2016), 10 pages.

* cited by examiner

DIGITAL ESTIMATION OF TRANSFER FUNCTIONS IN CONTINUOUS-TIME ANALOG-TO-DIGITAL CONVERTERS

TECHNICAL FIELD OF THE DISCLOSURE

The present disclosure relates generally to the field of electronic circuits and, more particularly, to systems and methods for data conversion.

BACKGROUND

Analog signals and/or values can be produced in various kinds of circuit elements, such as signal generators, sensors, and antennas. However, there can be many instances where having digital signals or values can be beneficial, such as for a processing or storing of the signals or values. To utilize the benefits of having a digital signal or value when an analog signal or value has been produced, analog-to-digital converters (ADCs) have been developed to convert the analog signal or value into a digital signal or value.

A signal may be a time-based sequence of values. A digital value may be represented by a code. A name of a code (for example, CODE1) may refer to a digital value represented by the code. Some (but not all) digital values may be represented by codes using binary-weighted encoding. A resolution of a digital value or code expressed in terms of a number of bits may refer to a binary-weighted encoding, regardless of how it may be encoded.

In many electronics applications, analog input values are converted to digital output values (for example, for further digital processing or storage). For instance, in precision measurement systems, electronics are provided with one or more sensors to make measurements, and these sensors may generate analog values. The analog values may be provided as an input to an ADC to generate digital output values for further processing or storage.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
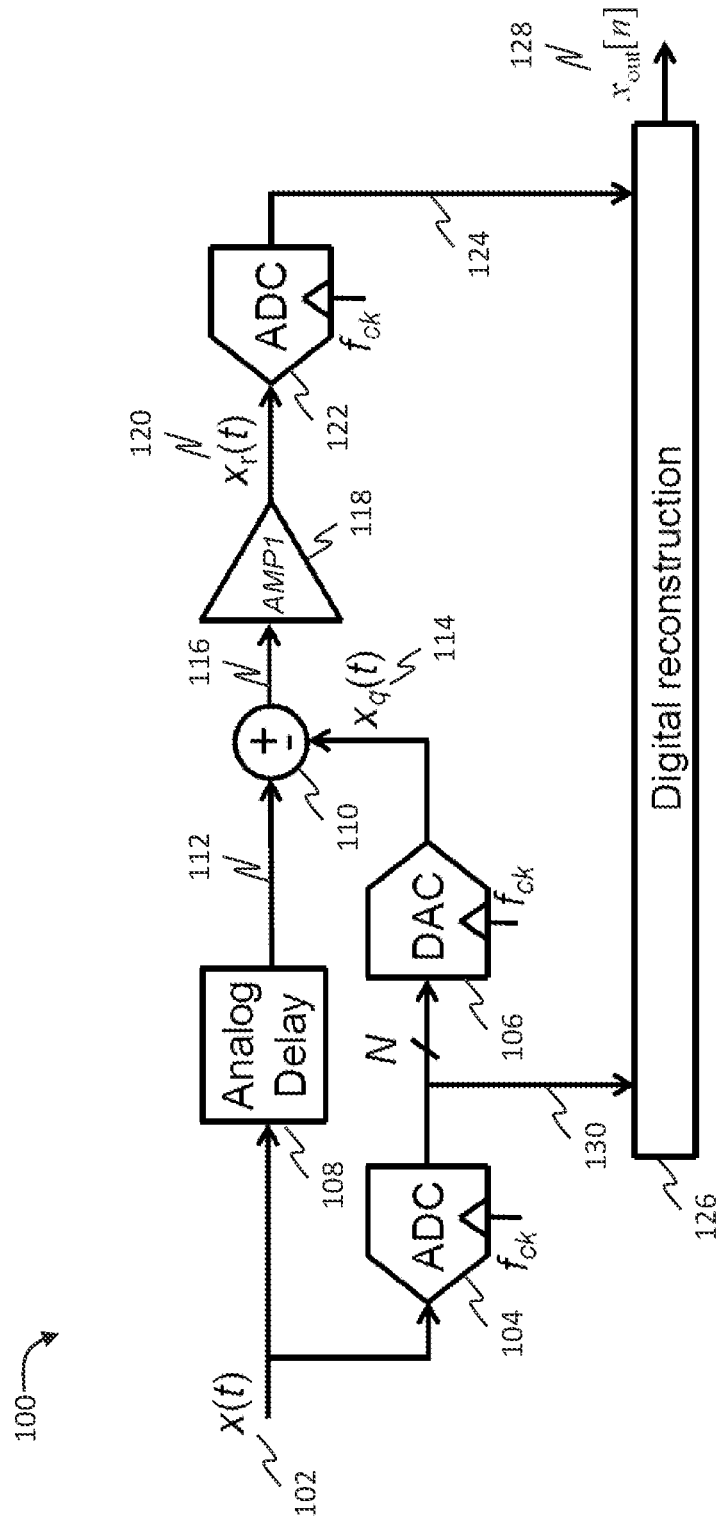
FIG. 1 provides a schematic illustration of a continuous-time (CT) ADC in which digital estimation of transfer functions may be implemented, according to some embodiments of the present disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating CT ADCs with digital estimation of transfer functions, proposed herein, it might be useful to first understand phenomena that may come into play in CT ADCs. The following foundational information may be viewed as a basis from which the present disclosure may be properly explained. Such information is offered for purposes of explanation only and, accordingly, should not be construed in any way to limit the broad scope of the present disclosure and its potential applications.

ADCs are electronic devices that convert a continuous physical quantity carried by an analog signal to a digital number that represents the quantity's amplitude (or to a digital signal carrying that digital number). The conversion involves quantization of the analog input signal, i.e., a process of mapping input values from a continuous set of analog values to output values in a countable smaller set of digital values, so it would introduce a small amount of error. Typically, the quantization occurs through periodic sampling of the analog input signal. The result is a sequence of digital values (i.e., a digital signal) that represents conversion of a CT and continuous-amplitude analog input signal to a discrete-time (DT) and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including NSD, signal to noise ratio (SNR), signal-to-noise-and-distortion ratio (SNDR), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

ADCs based on CT residue generation arrangements (e.g., CT pipelined (CTP) residue generation arrangements or CTP ADCs) are increasingly popular in high-performance and high-speed data converters, partly due to their inherent anti-aliasing and their potential to achieve high sampling rates, driven by their feedforward architecture. In a CT pipeline stage of an ADC, a CT analog input signal is sent to two different paths. A first path, typically referred to as a "feedforward" path, includes a cascade of an ADC typically referred to as a "quantizer" and a feedforward digital-to-analog converter (DAC). A second path, typically referred to as a "forward" path, includes an analog delay circuit to align the delays of the input signal in the feedforward and forward paths. A combiner may then subtract the output of the analog delay of the forward path from the output of the feedforward DAC in the feedforward path to generate a residue signal. This residue signal may then be processed, e.g., filtered and amplified by an amplifier, and the processed residue signal may be provided to subsequent stages of the ADC or to a backend ADC for the generation of the final output signal of the ADC based on the residue signal and based on the digital output of the quantizer of the feedforward path. For example, the quantizer may output a lower resolution and less accurate digital representation of the input signal value (e.g., a 5-bit digital value), while the residue signal indicative of the difference between the coarse conversion of the input value by the quantizer and the actual input value may allow generating a higher resolution and more accurate digital representation of the input signal value (e.g., a 10- or a 16-bit digital value).

As the foregoing illustrates, the feedforward architecture requires a tight alignment of the transfer functions undergone by the input signal in the two paths of a pipeline stage. In particular, the process of quantization performed by the quantizer of the feedforward path may result in a so-called quantization error, which may propagate further down the signal chain. In order to reduce or eliminate the quantization error added by the quantizer in the feedforward path, an accurate estimation and digital approximation of an analog transfer function undergone by the quantization error in each residue generation stage of the pipeline is required.

In the past, transfer function estimation has been done using a pseudo-random bit sequence (PRBS) that traverses almost the same signal path as the quantization error. However, inventors of the present disclosure recognized that, in some settings, conventional approaches to using the PRBS may result in some energy of the PRBS signal leaking into the analog delay circuit and the quantizer, leading to errors in transfer function estimation. In turn, errors in transfer function estimation may cause leakage of the quantization error from the quantizer into the ADC output signal, thus limiting achievable NSD/SNDR and anti-aliasing of the ADC.

Embodiments of the present disclosure provide devices and methods that aim to reduce or eliminate errors in transfer function estimation when test signals such as PRBS are used in CT stages of ADCs. In one aspect of the present disclosure, a transfer function estimation circuit configured to generate an estimate of a transfer function undergone by signals between an input of a feedforward DAC of a feedforward path of a CT stage of an ADC and an output of a backend ADC of the ADC is disclosed. The estimation circuit includes one or more circuits configured to generate a first cross-correlation output by cross-correlating digital versions of signals based on a test signal provided to the CT stage and an output signal of the backend ADC, generate a second cross-correlation output by cross-correlating digital versions of signals based on the test signal and an output signal of a quantizer of the feedforward path of the CT stage, and generate the estimate of the transfer function based on the first and second cross-correlation outputs (i.e., the transfer function is estimated in the digital domain). Such digital estimation of the transfer function may advantageously help reduce or eliminate errors in transfer function estimation by accounting for the energy of the test signal that may have leaked into the analog delay circuit and the quantizer.

Mechanisms described herein may be applicable to CT as well as hybrid (i.e., part CT, part DT) ADCs and may be implemented in ADCs of various types of architectures, such as pipelined ADCs, multi-stage noise shaping (MASH) ADCs, voltage controller oscillator (VCO) ADCs, and other ADCs utilizing generation and processing of residue signals. In general, in context of the present disclosure, describing an ADC as a "CT ADC" refers to any ADC that may include at least one CT residue generation stage (thus, "CT ADCs" described herein may, alternatively, be referred to as "CT residue generation arrangements"), and may also include one or more DT stages. Some of the mechanisms described herein may be especially attractive for high-performance and high-speed converter applications.

As will be appreciated by one skilled in the art, at least some aspects of the present disclosure, in particular at least some aspects of residue generation with digital estimation of transfer functions in CT ADCs as described herein, may be embodied in various manners, e.g., as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." At least some functions described in this disclosure may be implemented as an algorithm executed by one or more hardware processing units, e.g., one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing ADCs and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" or the term "signal" may be omitted (e.g., an analog input signal 102 shown in the present drawings may be referred to in the present descriptions as an "analog input 102" etc.). If used, the terms "substantially," "approximately," "about," etc., may be used to generally refer to being within +/−20% of a target value, e.g., within +/−10% of a target value, based on the context of a particular value as described herein or as known in the art.

Other features and advantages of the disclosure will be apparent from the following description and the claims.

Example CT ADC with a CT Stage and a Backend ADC

FIG. 1 provides a schematic illustration of a CT ADC 100 in which digital estimation of transfer functions may be implemented, according to some embodiments of the present disclosure.

As shown in FIG. 1, the ADC 100 may be configured to receive a CT analog input signal, x(t), 102, e.g., an analog voltage Vin(t). Although not specifically shown in FIG. 1, the ADC 100 may include a sample-and-hold (S/H) circuit configured to sample the analog input signal x(t) at a sampling instant (e.g., t=T0) and output a held analog value X of the sampling instant (e.g., output a held analog value VIN at the sampling instant). A value of the analog input signal x(t) is sent to two different paths: a feedforward path and a forward path. The feedforward path includes a cascade of a quantizer 104 and a feedforward DAC 106. The forward path includes an analog delay circuit 108, configured to apply an analog delay to the input signal 102. Thus, the CT analog input x(t) 102 (i.e., a given analog value of the input signal x(t)) is applied to the delay circuit 108 in the forward path and to a cascade of an N-bit ADC implementing the quantizer 104 and an N-bit DAC implementing the feedforward DAC 106, each of which may be clocked at a sampling rate of $f_{ck}$ in the feedforward path. The quantizer 104 may be configured to derive and output (an output signal 130) a digital value (e.g., CODE1) representing the analog value of the input signal x(t) provided thereto. For example, CODE1 may be a relatively low-resolution digital representation of X, e.g., VIN (i.e., the held analog value at a sampling instant t=T0). The ADC 100 may be configured to derive and process a residue of X (e.g., of VIN) with respect to CODE1 as a step of a method to derive a higher resolution and more precise digital representation of X (e.g., of VIN). Specifically, the feedforward DAC 106 may be configured to derive and output (an output signal $x_q(t)$, 114) an analog representation of CODE1 and a difference between X and the analog representation of CODE1 is a residue value VRES (i.e., a value of the residue signal 116). For example, a combiner (e.g., a subtractor) 110 may generate a residue signal 116 based on a delayed input signal 112 (which is the output of the forward path) and an output, $x_q(t)$, 114 of the DAC 106 (which is the output of the feedforward path). For example, in some embodiments, the combiner 110 may generate the residue signal 116 by subtracting the feedforward path output 114 from the forward path output 112, or the other way around. The residue signal 116 may be seen as a signal indicative of the quantization error arising from the quantization process performed by the quantizer 104. Therefore, in some of the subsequent drawings the residue signal 116 is labeled as "eq" (where "e" stands for "error" and "q" stands for "quantization"). The residue signal 116 may then be processed, e.g., filtered and amplified by an amplifier/filter, AMP1, 118, and the processed residue signal 120 may be provided to subsequent pipeline stages that may be implemented in the ADC 100 (subsequent pipeline stages not specifically shown in FIG. 1). Eventually (e.g., after the last pipeline stage of the ADC 100), a signal based on the processed residue signal 120 may be provided to a backend ADC 122, to be digitized by the backend ADC 122 to generate a digital residue signal 124. For example, the backend ADC 122 may be configured to generate a digital representation CODE2 of a residue value VRES accounting for a factor of gain A provided by the amplifier 118. The ADC 100 may further include a digital reconstruction circuit 126, configured to generate an ADC output $x_{out}[n]$, 128 based on the digital residue signal 124 output by the backend ADC 122, a digital signal 130 output by the quantizer 104 (e.g., the signal $s_1[n]$ labeled in some of the subsequent drawings), and any digital signals generated by the quantizers in the other pipeline stages in the ADC (not shown in FIG. 1). For example, the digital reconstruction circuit 126 may be configured to derive a high-resolution representation of a given value of the input signal 102 (e.g., of the value VIN) based on a combination of CODE1 and CODE2.

The quantizer 104, the DAC 106, the delay circuit 108, the combiner 110, and the amplifier 118 may be considered to be a first stage, or a residue generation arrangement, of the ADC 100. In some embodiments, the ADC 100 may include multiple such stages (i.e., multiple CT stages), coupled in series, i.e., the input signal 102 for a stage i+1 may be based on (e.g., may be substantially the same as) the amplified residue signal 120 of a stage i, where i may be a positive integer indicating the positions of stages in a series of consecutive stages of the ADC 100 (e.g., an integer between 1 and M if the ADC 100 includes M residue generation stages). In some embodiments, each of such stages may include a respective (i.e., own) digital reconstruction circuit 126, where the digital reconstruction circuit 126 of the stage i may be configured to generate an ADC output based on the digital signal 130 output by the quantizer 104 of the stage i and the ADC output generated by the digital reconstruction circuit 126 of the stage i+1, and the digital reconstruction circuit 126 of the last stage M may be configured to generate its ADC output based on the digital signal 130 output by the quantizer 104 of the stage M and the digital residue signal 124 output by the backend ADC 122, configured to receive a signal indicative of the residue signal 116 output by the combiner 110 of the stage M (e.g., to receive the signal 120).

In other embodiments, the first stage of the ADC 100 may be coupled to a second stage, configured to process a signal based on the residue signal output by the first stage, but the second stage may be a DT stage.

Figure 2:
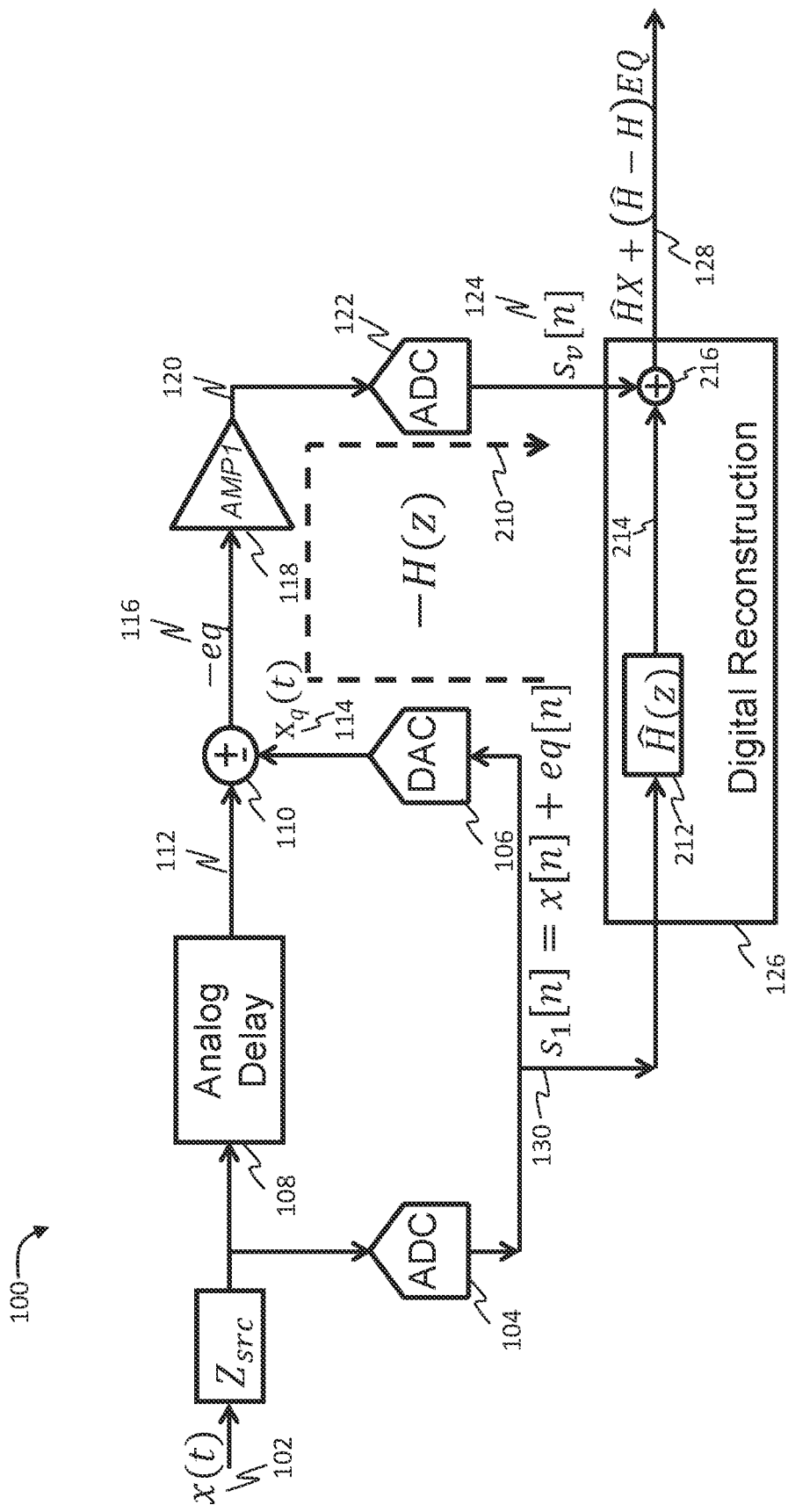
FIG. 2 provides a schematic illustration of the CT ADC of FIG. 1, further illustrating example details of a digital reconstruction circuit, according to some embodiments of the present disclosure.

FIG. 2 provides a schematic illustration of the CT ADC 100 of FIG. 1, further illustrating example details of the digital reconstruction circuit 126, according to some embodiments of the present disclosure.

As described above, the process of quantization performed by the quantizer of the feedforward path, e.g., the quantizer 104, may result in a quantization error which is represented by the residue signal 116 (i.e., the output signal of the combiner 110). Hence, FIG. 2 labels the output signal of the combiner 110 as a signal "−eq". While the residue signal 116 is an analog signal indicative of the quantization error of the quantizer 104, the output signal 130 of the quantizer 104 is a digital signal, and is also indicative of the quantization error of the quantizer 104, as is shown in FIG. 2 with the quantizer output signal 130 being a digital signal $s_1[n]=x[n]+eq[n]$, where $x[n]$ is a sampled version of the analog input signal $x(t)$ (i.e., the signal 102) (e.g., $X[n]$ may represent an analog signal sampled at an instance $n*Ts$, where Ts is the sampling period, and n is an integer indicative of the sampling instance) and $eq[n]$ is the quantization error signal generated by the operation of the quantizer 104.

A path 210, shown in FIG. 2 with a dashed arrow, indicates a path for signals between the input to the feedforward DAC 106 and the output of the backend ADC 122. A transfer function undergone by the signals travelling the path 210 may be labeled as "−H(z)", as shown in FIG. 2 with this label placed within the path 210. The digital reconstruction circuit 126 may then be configured to generate the output signal 128 based on the estimate of the transfer function $H(z)$, the estimate illustrated as a transfer function $\hat{H}(z)$ (in accordance with a common mathematical notation to use the hat sign to indicate a function is an estimate).

Different embodiments are possible for the digital reconstruction circuit 126 to be configured to generate the output signal 128 based on the estimate $\hat{H}(z)$ of the transfer function $H(z)$. In some embodiments, the digital reconstruction circuit 126 may include a transfer function application circuit 212 and a further combiner 216. One such embodiment is shown in FIG. 2, illustrating that the transfer function application circuit 212 may be configured to apply the estimate $\hat{H}(z)$ to a signal based on the quantizer output 130, to generate an output signal 214, and the combiner 216 may then be configured to generate the output signal 128 by combining (e.g., adding) a signal indicative of the output signal 214 and a signal based on the backend ADC output 124, $s_v[n]$. In such an embodiment, the output signal 128 may be represented as $\hat{H}X+(\hat{H}-H)EQ$, where X is a frequency-domain representation of $x[n]$, the sampled version of the analog, time-domain, input signal $x(t)$ and EQ is a frequency-domain representation of the time-domain quantization error signal eq. In other embodiments, the transfer function application circuit 212 and the combiner 216 may be arranged differently to generate the output signal 128, but the output signal 128 would still be represented as $\hat{H}X+(\hat{H}-H)EQ$ with some scaling. For example, in one other embodiment (not shown in FIG. 2), the transfer function application circuit 212 may be provided in the path between the output of the backend ADC 122 and the combiner 216 and may be configured to apply an inverse of the estimate $\hat{H}(z)$ (i.e., to apply $1/\hat{H}(z)$) to a signal based on the backend ADC output 124, $s_v[n]$, and the combiner 216 may then be configured to generate the output signal 128 by combining (e.g., adding) a signal indicative of the output signal from the transfer function application circuit 212 and a signal based on the quantizer output 130. In this case, the output signal 128 would still be represented as $$\frac{\hat{H}X + (\hat{H} - H)EQ}{\hat{H}}.$$

In another embodiment (also not shown in FIG. 2), a first transfer function application circuit like the circuit 212 may be provided as shown in FIG. 2 and a second one may be provided in the path between the output of the backend ADC 122 and the combiner 216, as in the previous embodiment. Then the first transfer function application circuit may apply a first transfer function that is based on the estimate $\hat{H}(z)$ to a signal based on the quantizer output 130, the second transfer function application circuit may apply a second transfer function that is based on the estimate $\hat{H}(z)$ to a signal based on the backend ADC output 124, and the combiner may be configured to combine the outputs of these two circuits to generate the output signal 128. The results of generating the ADC output signal 128 according to these three embodiments may be substantially the same, except, possibly, for some scaling. As the foregoing illustrates, in both embodiments, the output signal 128 may include a component indicative of the quantization error eq, unless the estimate $\hat{H}(z)$ is equal to the actual transfer function $H(z)$.

Example CT ADC Using Test Signals to Reduce Effects of Quantization Errors

As the foregoing description illustrates, for the quantization error eq to be canceled in digital reconstruction, the estimate $\hat{H}(z)$ should accurately represent the actual transfer function $H(z)$. In other words, if the estimate $\hat{H}(z)$ accurately represents the actual transfer function $H(z)$ so that $\hat{H}(z)=H(z)$, the second term of the output signal 128 shown in FIG. 2 (i.e., $(\hat{H}-H)EQ$) would be canceled and the output signal 128 would only include the first term (i.e., $\hat{H}X$).

Figure 3:
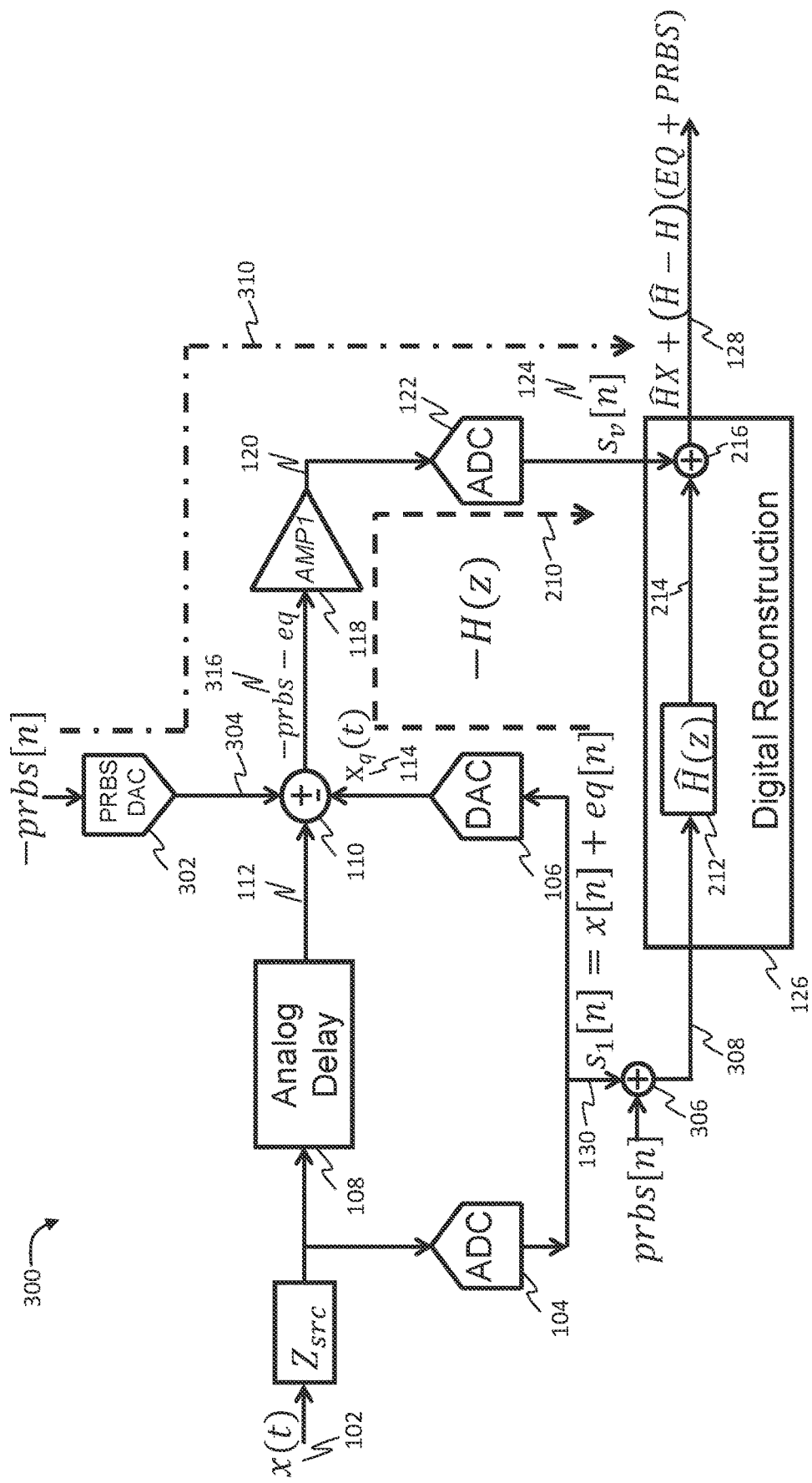
FIG. 3 provides a schematic illustration of a CT ADC similar to that shown in FIG. 2, further configured to use a test signal, according to some embodiments of the present disclosure.

As briefly described above, in the past, transfer function estimation has been done using a PRBS that traverses almost the same signal path as the quantization error. FIG. 3 provides a schematic illustration of a CT ADC 300 similar to the ADC 100 shown in FIG. 2. In FIG. 3, the same reference numerals and letters as those used in FIG. 2 are intended to illustrate the same or analogous features as those described with reference to the ADC 100 so that, in the interests of brevity, their description does not have to be repeated for FIG. 3. The ADC 300 is similar to the ADC 100 except that the ADC 300 is further configured to use a test signal, e.g., a PRBS, according to some embodiments of the present disclosure.

As shown in FIG. 3, in some embodiments, an analog version of a digital test signal, prbs[n], may be provided to the combiner 110 as an analog test signal 304. In some embodiments, the digital version of the test signal prbs[n] may be generated by a test signal generator (not shown in FIG. 3) and provided to a DAC 302, configured to convert the digital test signal prbs[n] to the analog test signal 304. The combiner 110 may then be configured to combine the analog test signal 304 with the analog delayed input signal 112 (i.e., the output of the forward path) and the output, $x_q(t)$, 114 of the DAC 106 (i.e., the output of the feedforward path). For example, in some embodiments, the combiner 110 may be configured to generate a signal 316 that may be referred to as a "test residue signal" by adding the analog test signal 304 to the analog delayed input signal 112 and subtracting the feedforward path output 114 from the forward path output 112, or the other way around. The test residue signal 316 may be seen as a signal indicative of the quantization error arising from the quantization process performed by the quantizer 104, as well as of the test signal injected into the residue signal 116 in order to improve accuracy of the transfer function estimation. Therefore, in some of the subsequent drawings the residue signal 316 is labeled as "−prbs−eq". A path 310, shown in FIG. 3 with a dash-dotted arrow, indicates a path for the test signal prbs[n] through the combiner 110 and the backend ADC 122 to the output signal 128. If the DAC 302 matches the feedforward DAC 106, then, ideally, both the signal eq and the signal prbs undergo the same transfer function −H(z), before emerging at the output 124 of the backend ADC 122. Cross-correlating this output 124 with −prbs then provides the estimate of H(z), i.e., $\hat{H}(z)$, which may be used by the transfer function application circuit 212 of the digital reconstruction circuit 126 in the manner described above.

To effectively cancel the test signal injected into the residue signal 116 from the ADC output 128, a digital version of the test signal may be injected into the output 130 of the quantizer 104. As shown in FIG. 3, this may be done using a combiner 306, configured to add the digital test signal prbs[n] to the quantizer output signal 130 to generate a modified digital signal 308, which may, e.g., be $s_1[n]$+ prbs[n]=x[n]+eq[n]+prbs[n]. The modified digital signal 308 may then be provided to the digital reconstruction circuit 126 to be processed as discussed above for the quantizer output signal 130, except that now the signal 308 replaces the quantizer output signal 130 in being processed by the digital reconstruction circuit 126. Adding the digital test signal prbs[n] to the quantizer output signal 130 to generate the modified digital signal 308 to be processed by the digital reconstruction circuit 126 can help reduce or eliminate presence of the digital test signal prbs[n] in the output signal 128, thus reducing noise.

When the test signal prbs[n] is used in this manner, ideally, the output signal 128 may be represented as $\hat{H}X$+ $(\hat{H}-H)(EQ+PRBS)$, where PRBS is a frequency-domain representation of the digital, time-domain test signal prbs[n] or the analog version thereof. Similar to FIG. 2, for the embodiment shown in FIG. 3, if the estimate $\hat{H}(z)$ accurately represents the actual transfer function H(z) so that $\hat{H}(z)=H(z)$, the second term of the output signal 128 shown in FIG. 3 (i.e., $(\hat{H}-H)(EQ+PRBS)$) would be canceled and the output signal 128 would only include the first term (i.e., $\hat{H}X$). Mismatch in H(z) and $\hat{H}(z)$ causes the signals eq and prbs leakage to the ADC output signal 128 and unacceptable NSD degradation.

Figure 4:
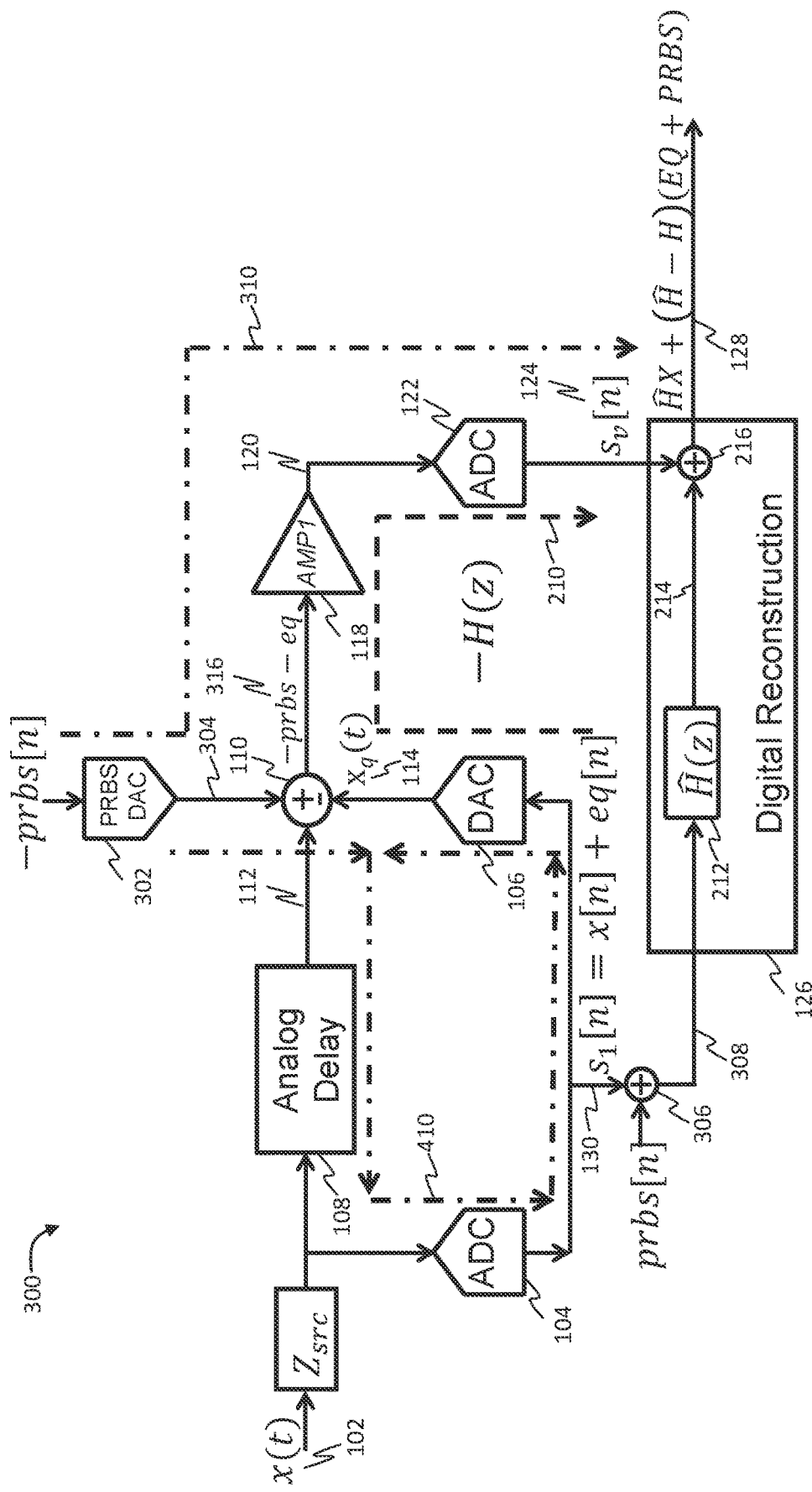
FIG. 4 provides a schematic illustration of the CT ADC of FIG. 3, further illustrating a leakage path of the test signal, according to some embodiments of the present disclosure.

Unfortunately, inventors of the present disclosure realized that, in some implementations, the output signal 128 is not as is shown in FIG. 3 and that the estimate $\hat{H}(z)$ and the actual transfer function H(z) do not match, thus causing leakage of the quantization error and the test signal prbs[n] into the output and degradation of the NSD. In particular, inventors of the present disclosure inferred that, in some implementations, the signal prbs may leak to the backend ADC output 124 and, thus, into the ADC output signal 128 through an additional path passing through the quantizer 104. Such a path is shown as a path 410, illustrated with a dash-dotted arrow in FIG. 4. FIG. 4 provides a schematic illustration of the CT ADC 300 of FIG. 3, further illustrating the leakage path 410 of the test signal, according to some embodiments of the present disclosure. With finite input-output impedances of the filter 118 and the (reciprocal passive) delay line circuit 108, a portion (for example, about 1%) of prbs may flows back through the delay line circuit 108 into the quantizer 104 input and, with the ADC input termination impedance Zsrc being greater than zero, produce a prbs-dependent swing at the quantizer 104 input. With the input signal 102 disabled, this swing is typically not enough to cross any quantization levels of the quantizer 104. However, presence of the input signal 102 allows the "flowback" prbs to be quantized by the quantizer 104 and to leak into its output signal 130.

The leaked prbs may further circulate in what appears as a parasitic negative feedback loop in the first stage: −prbs is the input (via the DAC 302), the delay line circuit 108 may act as the loop filter, and the cascade of the quantizer 104 and the feedforward DAC 106 provided the output signal 114 that may be subtracted from −prbs at the combiner 110. With the ADC input 102 disabled, the quantizer 104 may show no output activity, effectively breaking this parasitic loop. The estimated $\hat{H}(z)$ is then substantially equal to H(z), causing the NSD to be on target. Conversely, with the ADC input 102 or the quantizer linearization digital test signal injection at the combiner 306 enabled, the parasitic loop 410 is activated. The extra prbs-related component may then circulate in it, leak into the filter 118, and appear at the backend ADC output 124. Cross-correlation of this output 124 with −prbs then produces an $\hat{H}(z)$ that does not match H(z). This causes eq leakage into the ADC output 128 and a degradation of the ADC NSD.

One way to address the problem described above may be to implement an analog solution that involved reducing the amount of prbs that flows into the input of the quantizer 104. This can be achieved by, e.g., lowering the input impedance of the filter 118, and/or lowering the impedance Zsrc (assuming that the delay line output impedance is much larger than Zsrc). The inventors of the present disclosure further recognized that another way may be to employ a digital solution to estimate transfer functions (i.e., to employ digital estimation of transfer functions), described below.

Example CT ADC Using Test Signals and Digital Estimation of Transfer Functions

Figure 5:
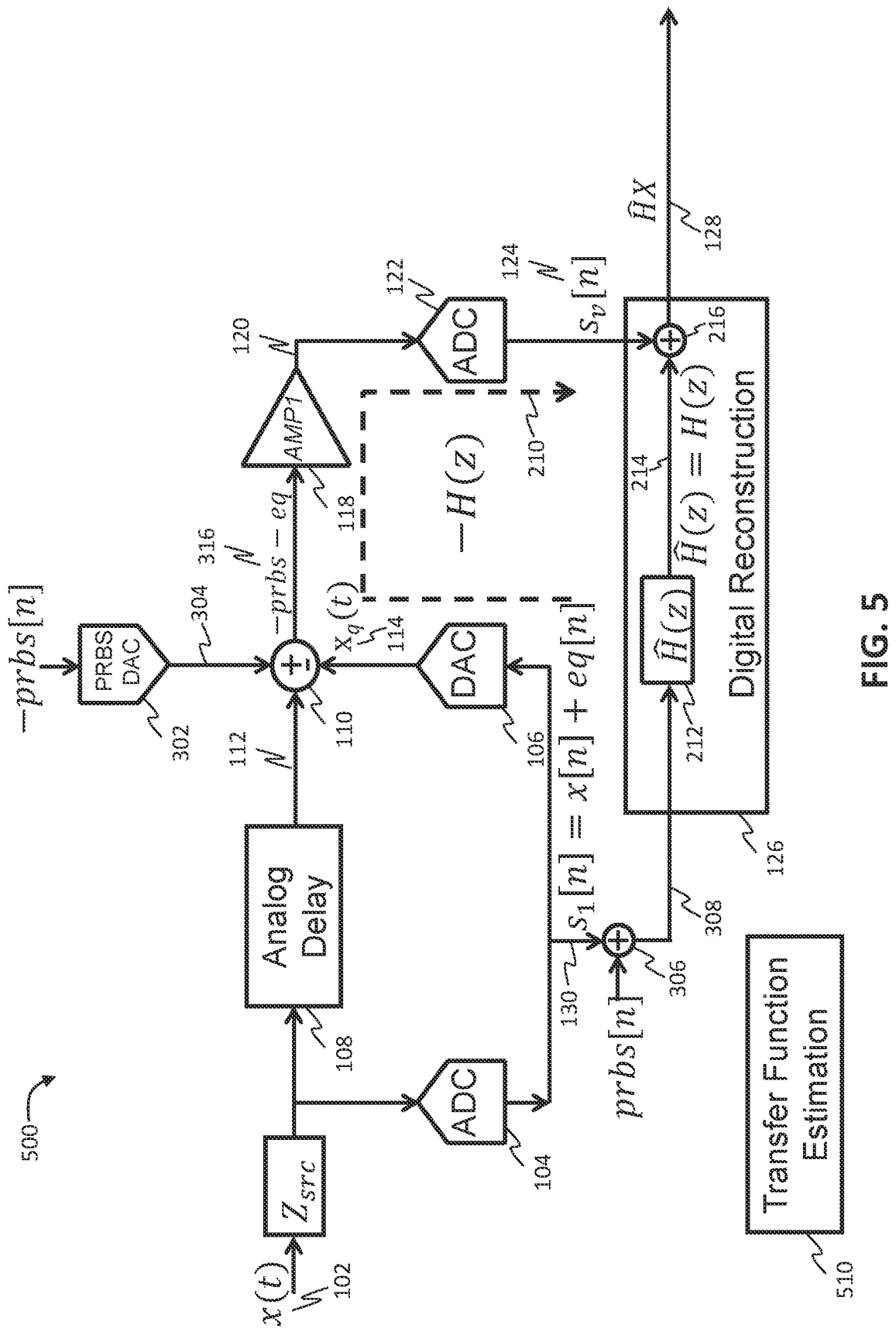
FIG. 5 provides a schematic illustration of a CT ADC similar to that shown in FIG. 3, further configured to implement digital estimation of transfer functions, according to some embodiments of the present disclosure.
Figure 10:
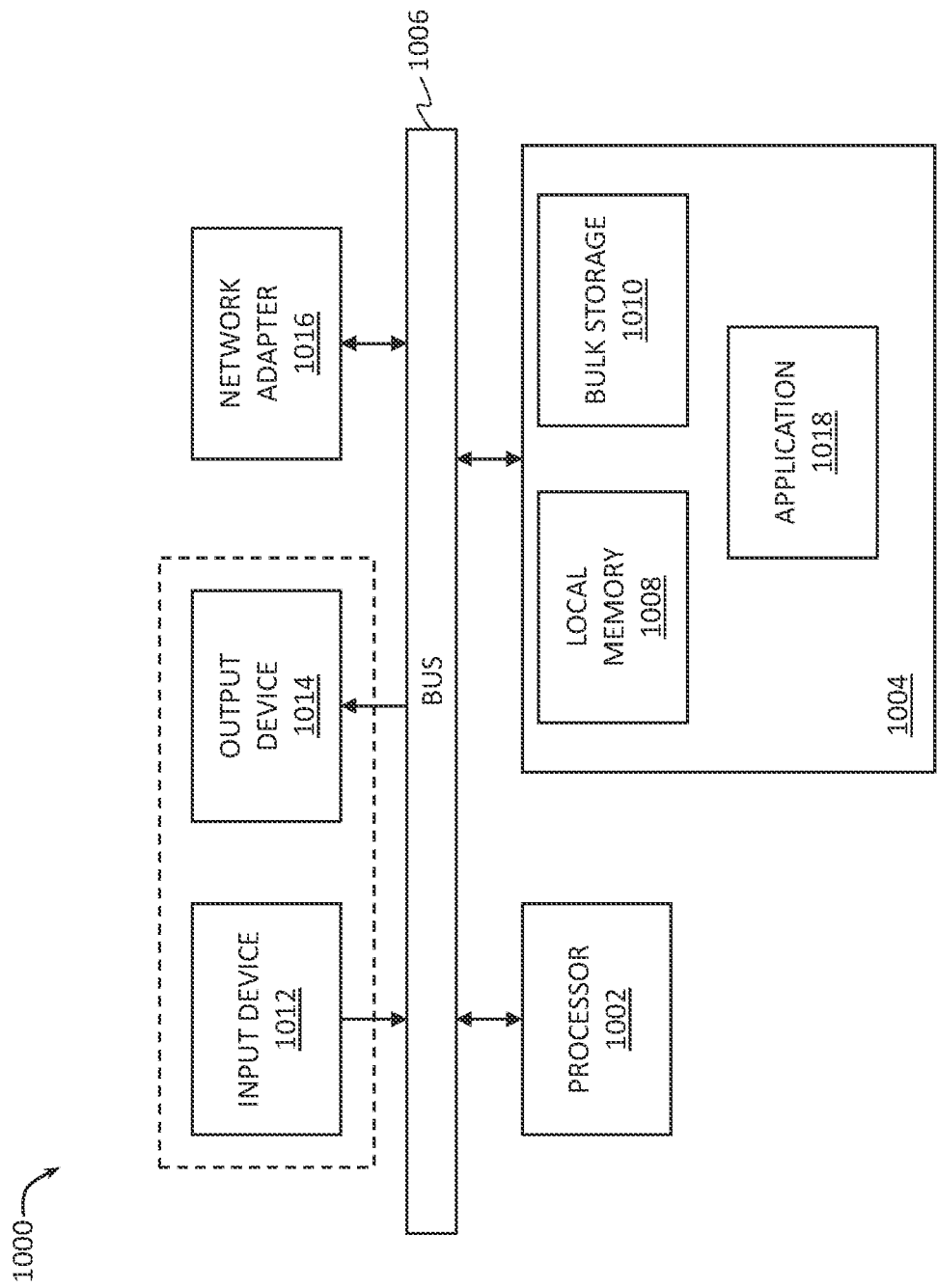
FIG. 10 provides a block diagram illustrating an example data processing system that may be configured to implement, or control, at least portions of performing digital estimation of transfer functions in CT ADCs, according to some embodiments of the present disclosure

FIG. 5 provides a schematic illustration of a CT ADC 500 similar to the ADC 300 shown in FIG. 3, further configured to implement digital estimation of transfer functions, according to some embodiments of the present disclosure. In FIG. 5, the same reference numerals and letters as those used in FIG. 3 are intended to illustrate the same or analogous features as those described with reference to the ADC 300 so that, in the interests of brevity, their description does not have to be repeated for FIG. 5. The ADC 500 is similar to the ADC 300 except that the ADC 500 further includes a transfer function estimation circuit 510, configured to implement digital estimation of transfer functions, according to some embodiments of the present disclosure. The transfer function estimation circuit 510 may be implemented as any suitable data processing system having a memory and a processor, one example of which is shown in FIG. 10. Functionality of the transfer function estimation circuit 510 may be illustrated with reference to FIG. 6, provides a schematic illustration of the transfer function estimation circuit 510 performing digital estimation of a transfer function H(z), according to some embodiments of the present disclosure.

Figure 6:
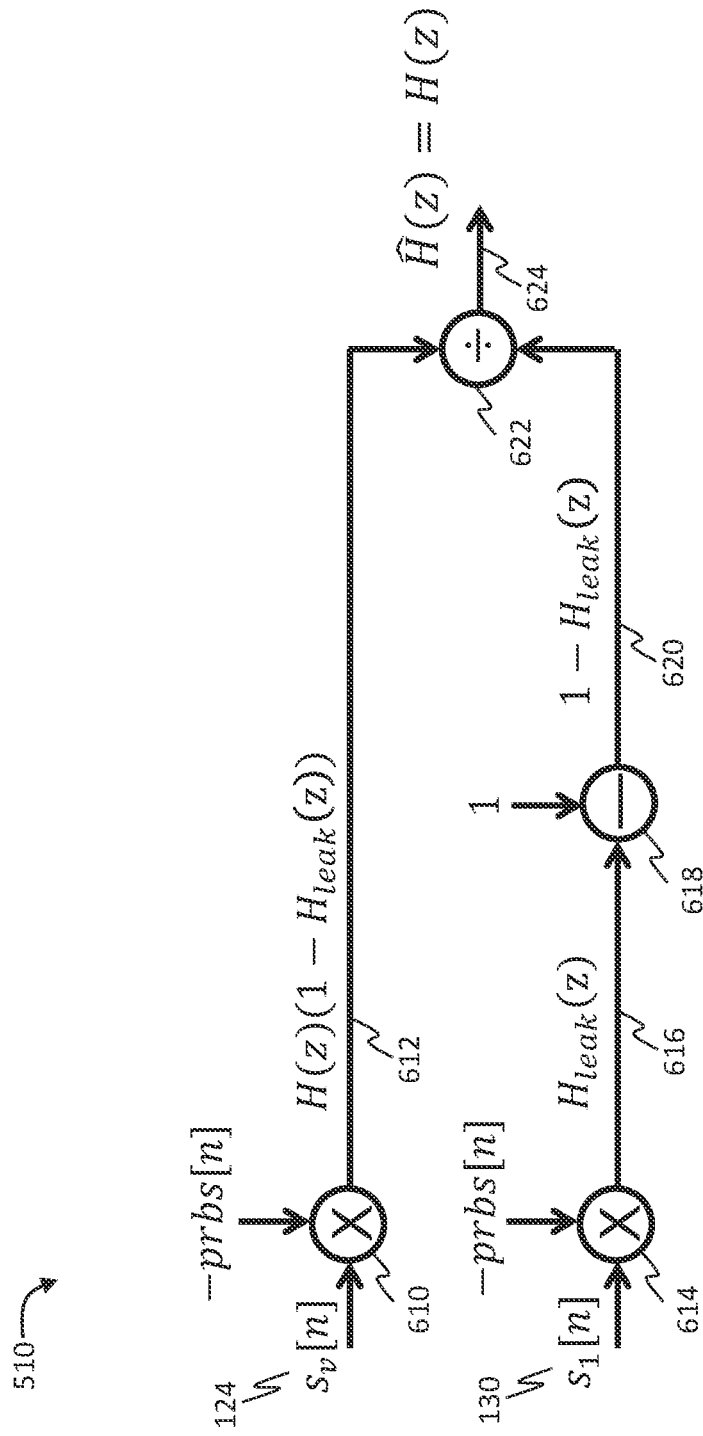
FIG. 6 provides a schematic illustration of a performing digital estimation of a transfer function $H(z)$, according to some embodiments of the present disclosure.

As shown in FIG. 6, the transfer function estimation circuit 510 may be configured to receive as inputs the following digital signals: the output signal 124 from the backend ADC 122, the output 130 of the quantizer 104, and the digital version of the test signal, prbs[n]. The transfer function estimation circuit 510 may have a cross-correlator 610, configured to generate a first cross-correlation output 612 by cross-correlating digital versions of the test signal prbs[n] and the backend ADC output signal 124. The transfer function estimation circuit 510 may also have a cross-correlator 614, configured to generate a second cross-correlation output 616 by cross-correlating digital versions of the test signal prbs[n] and the quantizer output signal 130. At a high level, the transfer function estimation circuit 510 may then use the first cross-correlation output 612 and the second cross-correlation output 614 to generate the estimate Ĥ(z) of the transfer function H(z) undergone by signals between an input of the feedforward DAC 106 and an output of the backend ADC 122. In turn, the digital reconstruction circuit 126 may be configured to apply the estimate Ĥ(z) generated by the transfer function estimation circuit 510 to generate the ADC output signal 128 based on the backend ADC output signal 124, the quantizer output signal 130, and the estimate Ĥ(z) generated by the transfer function estimation circuit 510.

While FIG. 6 illustrates two separate cross-correlators 610 and 614, in some embodiments they may represent different cross-correlation operations performed by a single cross-correlator, e.g., sequentially (in any suitable order—either first the cross-correlation operation 610 and then 614, or the other way around). If a single cross-correlator is used to perform both cross-correlation operations 610 and 614, in some embodiments, the transfer function estimation circuit 510 may include a switching arrangement/selector such as a multiplexer, configured to provide correct inputs to the cross-correlator depending on which cross-correlation operation is supposed to be performed. For example, the switching arrangement may be configured to operate in a first mode or in a second mode. In the first mode, the switching arrangement may be configured to provide to the cross-correlator the signal based on the backend ADC output signal 124, to enable the cross-correlator to generate the first cross-correlation output 612. In the second mode, the switching arrangement may be configured to provide to the cross-correlator the signal based on the quantizer output signal 130, to enable the cross-correlator to generate the second cross-correlation output 616. In both modes, the digital test signal prbs[n] may be provided to such a cross-correlator, either via the switching arrangement or separately. In some embodiments, the selection of which input signal is provided to the shared cross-correlator may be based on a control signal received by (or applied to) the switching arrangement, indicating which input to the select and provide to the cross-correlator.

The first cross-correlation output 612 may be seen as a time-domain impulse response of a first transfer function, TF1, while the second cross-correlation output 616 may be seen as a time-domain impulse response of a second transfer function, TF2. In other words, the cross-correlation output 612 may be indicative of the transfer function TF1 and the second cross-correlation output 614 may be indicative of the transfer function TF2. The transfer function TF1 may be a product of the transfer function H(z) and a function based on a transfer function $H_{leak}(z)$, indicative of a portion of the test signal prbs[n] in the quantizer output signal 130. This is schematically illustrated in FIG. 6 with the first cross-correlation output 612 being labeled with the transfer function TF1 in the form of $H(z)(1-H_{leak}(z))$. On the other hand, the transfer function TF2 may be substantially same as the transfer function $H_{leak}(z)$ (i.e., the transfer function indicative of the portion of the test signal prbs[n] in the quantizer output signal 130). This is schematically illustrated in FIG. 6 with the second cross-correlation output 616 being labeled with the transfer function TF2 in the form of $H_{leak}(z)$. Generating the estimate Ĥ(z) of the transfer function H(z) may then be seen as the transfer function estimation circuit 510 performing a deconvolution based on the time-domain impulse response of the first transfer function TF1 and the time-domain impulse response of the second transfer function TF2.

In some embodiments, the second cross-correlation output 616 may be processed further before being used to generate the estimate Ĥ(z). As shown in FIG. 6, the transfer function estimation circuit 510 may further include a combiner 618, configured to, at a high level, subtract from 1 the second transfer function TF2 to generate a modified second cross-correlation output 620 that is indicative of a transfer function $1-H_{leak}(z)$ (a person of ordinary skill in the art would recognize that the operation performed by the combiner 618 is a frequency-domain operation, the time-domain equivalent being $\delta[n]-h_{leak}[n]$, where $\delta[n]$ represents a digital impulse (e.g., a value of 1 followed by zeros) and $h_{leak}[n]$ represents the impulse response corresponding to $H_{leak}(z)$. As also shown in FIG. 6, the transfer function estimation circuit 510 may further include a combiner 622, configured to combine the first cross-correlation output 612 and the modified second cross-correlation output 620 to generate an output 624 that may be seen as a digitally corrected transfer function indicative of the estimate Ĥ(z) that is expected to be an accurate representation of the transfer function H(z). For example, the combiner 622 may be configured to perform an operation that is equivalent to dividing the first transfer function TF1 by a transfer function based on the second transfer function TF2, e.g., equivalent to dividing the first transfer function TF1=$H(z)(1-H_{leak}(z))$ by the transfer function $(1-H_{leak}(z))$.

The output 624 indicative of the estimate Ĥ(z) may be provided from the transfer function estimation circuit 510 to the digital reconstruction circuit 126, which may then apply the estimate Ĥ(z) to generate the output signal 128. In various embodiments of the ADC 500, the digital reconstruction circuit 126 may be configured to use any of the ways to apply the estimate Ĥ(z) to generate the output signal 128, e.g., any of the two embodiments described above with reference to FIG. 2.

In some embodiments, computing of the first and second cross-correlation outputs 612 and 616 may be performed in digital hardware of the transfer function estimation circuit 510, while the rest of the operations of digitally estimating the transfer function H(z) according to any of the embodiments described herein may be performed in firmware of the transfer function estimation circuit 510. However, in other embodiments, any suitable manner may be used for implementing each of the functions of digitally estimating the transfer function H(z) according to any of the embodiments described herein.

Figure 7:
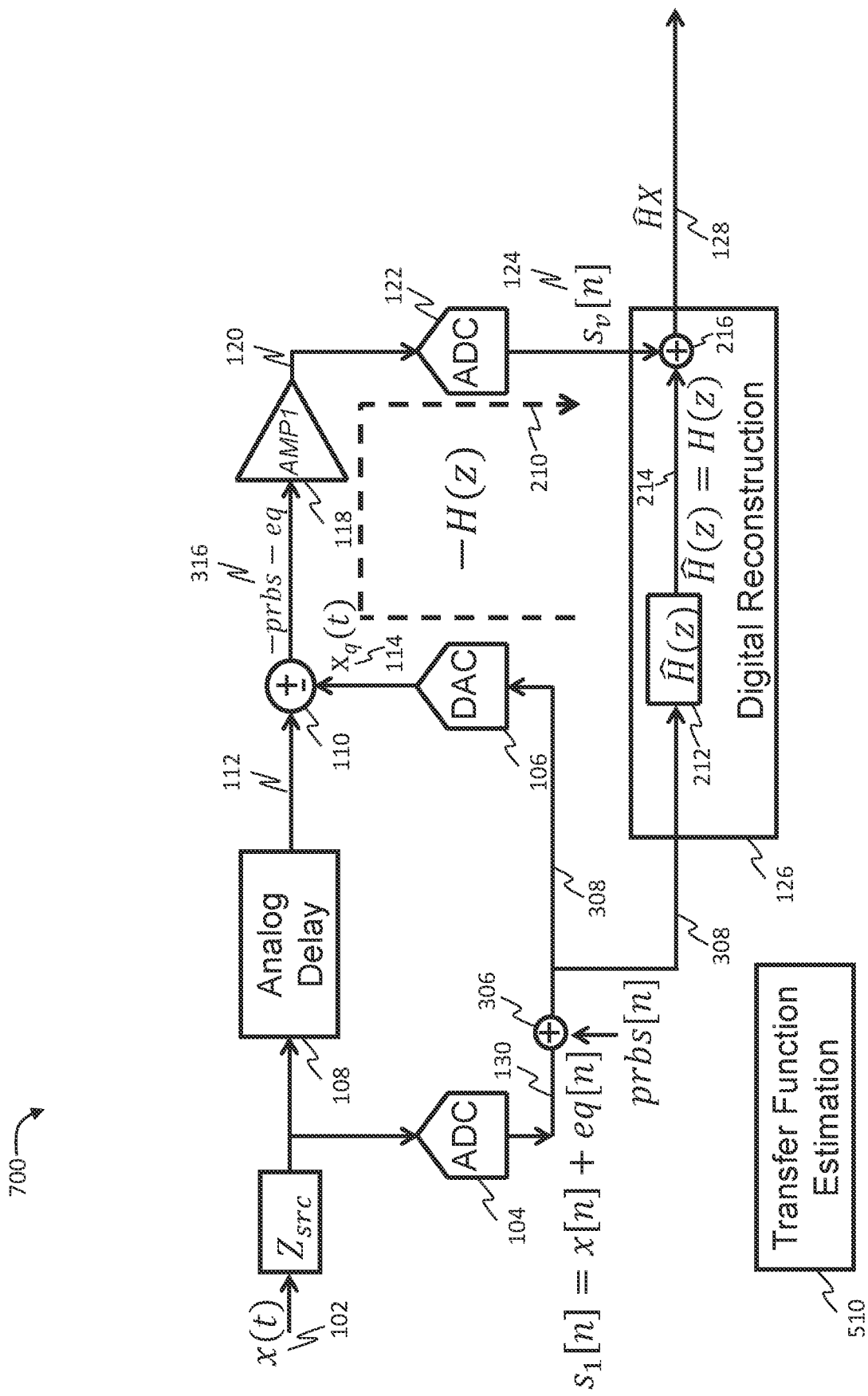
FIG. 7 provides a schematic illustration of a CT ADC similar to that shown in FIG. 5, configured to implement digital estimation of transfer functions with the digital test signal being injected into the path to the backend ADC, according to some embodiments of the present disclosure.

In some embodiments, the test signal prbs[n] may be a pseudo-random bit sequence or a dither signal. However, in other embodiments, the test signal prbs[n] used in the ADC 500 may be any other signal suitable for assisting generating the estimate $\hat{H}(z)$. It should also be noted that, while FIG. 5 illustrates an embodiment where an analog version of the digital test signal prbs[n] is injected into the signal path to the backend ADC 122 at the combiner 110, in other embodiments this may be implemented differently. For example, in some embodiments, instead of adding the analog version of the digital test signal prbs[n] at the combiner 110, the digital test signal prbs[n] may be added to the quantizer output 130 as shown in FIG. 7. In particular, FIG. 7 provides a schematic illustration of a CT ADC 700 similar to the ADC 500 shown in FIG. 5, configured to implement digital estimation of transfer functions, according to some embodiments of the present disclosure. In FIG. 7, the same reference numerals and letters as those used in FIG. 5 are intended to illustrate the same or analogous features as those described with reference to the ADC 500 so that, in the interests of brevity, their description does not have to be repeated for FIG. 7. The ADC 700 is similar to the ADC 500 except that, in the ADC 700, the analog version of the digital test signal prbs[n] is not injected into the signal path to the backend ADC 122 at the combiner 110, but, rather, the combiner 306, as described above, is implemented so that not only the digital reconstruction circuit 126 is configured to receive the modified digital signal 308 generated by the combiner 306, but also the feedforward DAC 106. By virtue of the feedforward DAC 106 then converting the modified digital signal 308 to an analog signal, the output of the combiner 116 may be the test residue signal 316 as described above (i.e., a signal indicative of the quantization error arising from the quantization process performed by the quantizer 104, as well as of the test signal prbs[n], except that now the test signal prbs[n] is injected as the digital test signal at the combiner 306).

The ADCs 500 or 700 may be used as residue generators in a CT stage of any of suitable multi-stage ADCs, such as CT as well as hybrid ADCs, implemented in various types of architectures, such as pipelined ADCs, MASH ADCs, VCO ADCs, and other ADCs utilizing residue signals. While FIGS. 5 and 7 illustrate single-ended implementation of various components of the ADCs 500 and 700, in other embodiments of the ADCs 500 and 700, one or more of input or output to any of the components shown (e.g., the delay circuit 108, the filter 118, the quantizer 104, etc.) may be differential.

Digital estimation of the transfer function H(z) according to any of the embodiments described herein may advantageously help reduce or eliminate errors in transfer function estimation by accounting for the energy of the test signal 304 that may have leaked into the analog delay circuit 108 and the quantizer 104. As a result, the NSD may be decreased, as is illustrated in FIG. 8.

Figure 8:
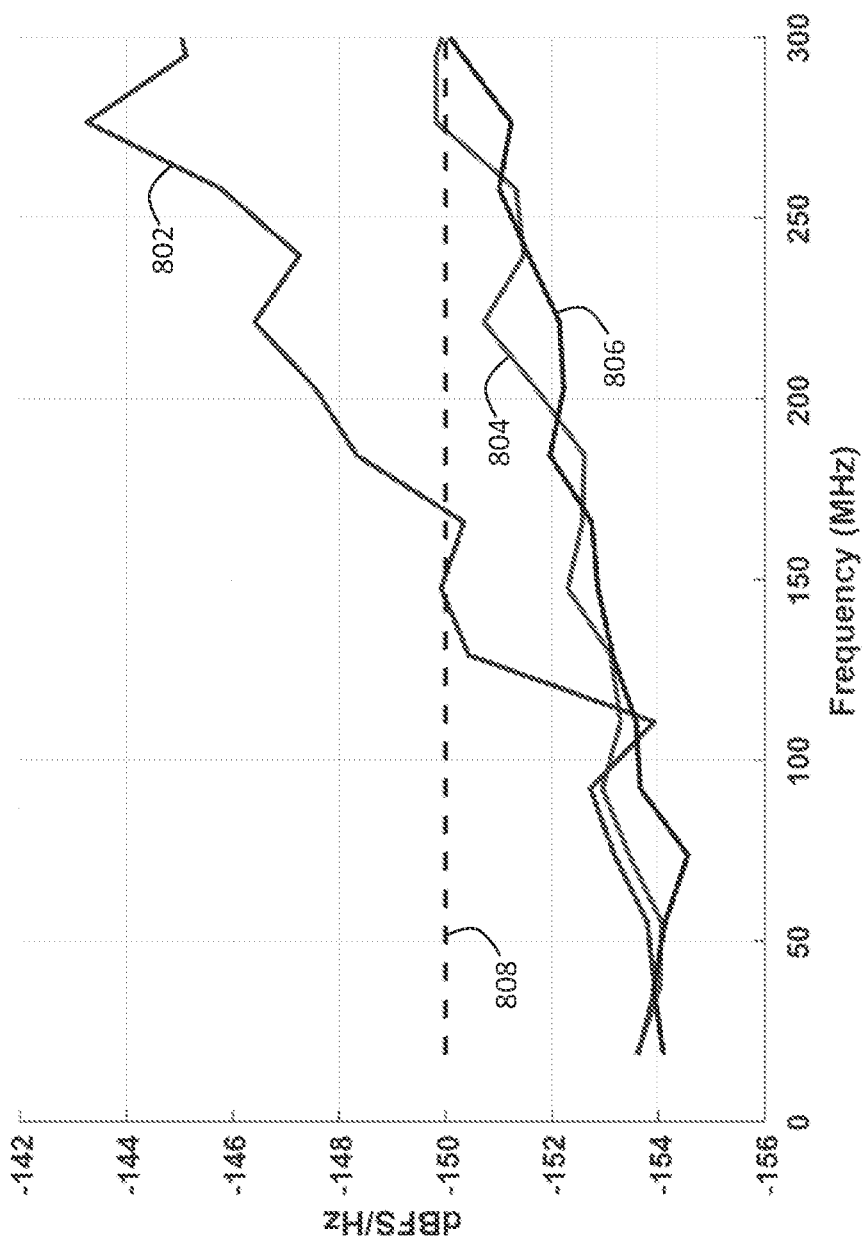
FIG. 8 illustrates a noise spectral density (NSD) for ADCs configured to implement various types of transfer function estimation, according to some embodiments of the present disclosure.

FIG. 8 illustrates an NSD as a function of frequency (e.g., it represents the noise power measured in a 1-Hz bandwidth at a certain frequency) for ADCs configured to implement various types of transfer function estimation, according to some embodiments of the present disclosure. In particular, a curve 802 illustrates an example of the estimate $\hat{H}(z)$ being generated by conventional means (e.g., using the ADC 300) with the input signal 102 being ON, a curve 802 illustrates an example of the estimate $\hat{H}(z)$ being generated by conventional means (e.g., using the ADC 300) with the input signal 102 being OFF, a curve 806 illustrates an example of the estimate $\hat{H}(z)$ being generated by implementing digital estimation of transfer functions as described herein (e.g., using the ADC 500 or the ADC 700) with the input signal 102 being ON, and a horizontal dashed line 808 illustrates an example of maximum value of the NSD that may be acceptable. As shown in FIG. 8, the curve 802 quickly exceeds the target maximum value of the NSD that is allowed, meaning that conventional means of generating the estimate $\hat{H}(z)$ with the input signal 102 being ON may not be acceptable for a large frequency range. The NSD values of the curve 804 are lower than those of the curve 802, but such NSD values may only be achieved when the input signal 102 is OFF, limiting the times when the estimate $\hat{H}(z)$ may be generated/updated. In addition, the NSD values of the curve 804 also exceed the target maximum value of the NSD for higher frequencies. In contrast, the NSD values of the curve 806 are mostly lower than those of the curve 804, for a larger frequency range, illustrating that generating the estimate $\hat{H}(z)$ by implementing digital estimation of transfer functions as described herein may yield acceptable NSD values while allowing to keep the input signal 102 ON.

Example RF Device

ADCs configured to implement digital estimation of transfer functions according to various embodiments described herein may be implemented in a multitude of various electronic devices. One frequent, non-limiting, example of electronic devices in which such ADCs may be implemented are RF devices.

Figure 9:
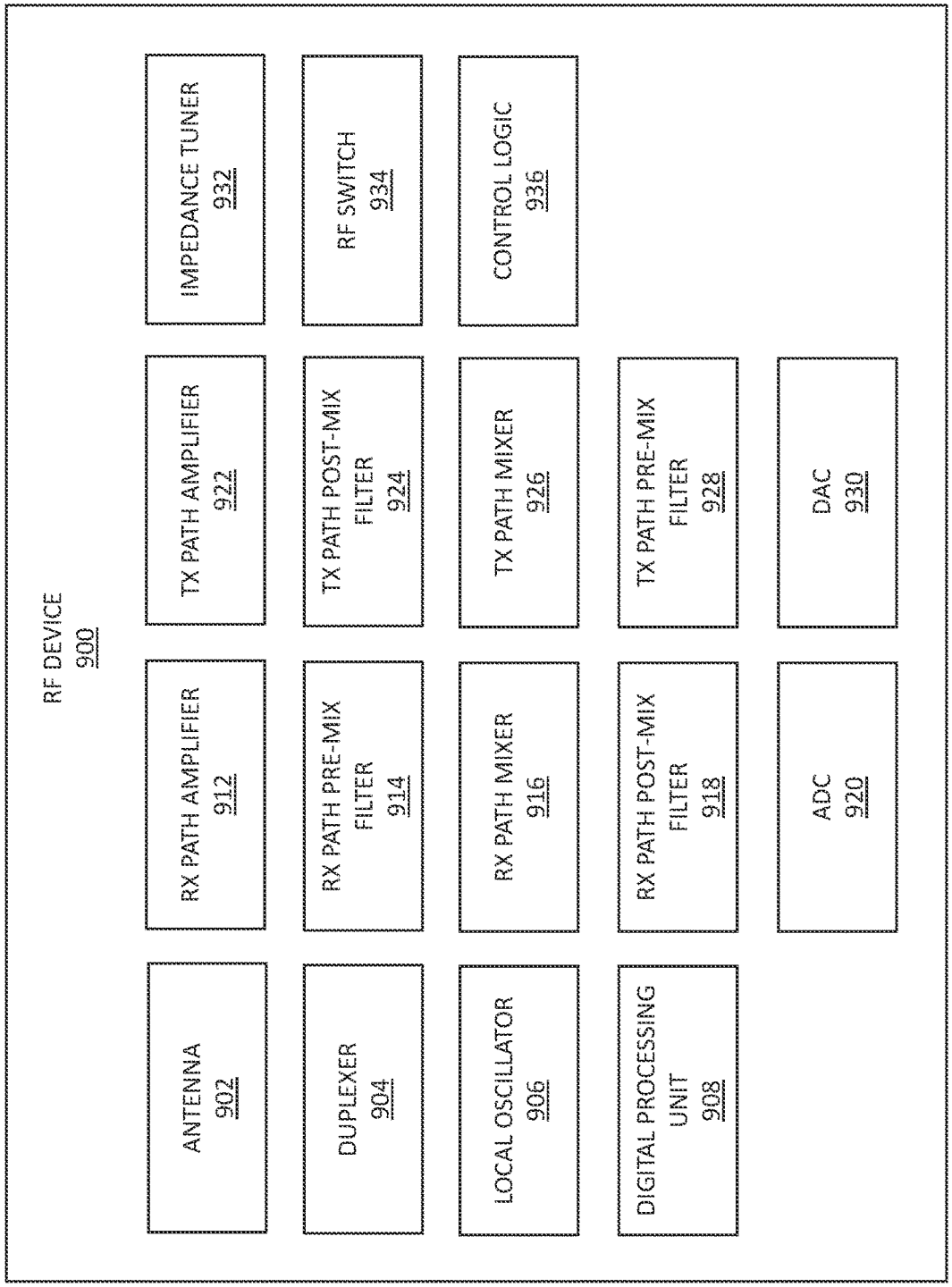
FIG. 9 provides a block diagram illustrating a radio frequency (RF) device in which a CT ADC with digital estimation of transfer functions may be implemented, according to some embodiments of the present disclosure.

RF devices are devices that transmit and receive signals in the form of electromagnetic waves in the RF range of approximately 3 kilohertz (kHz) to 300 gigahertz (GHz). RF devices are commonly used for a large variety of applications such as wired and wireless communications, automotive radar, industrial radar, medical applications, or military applications, with cellular/wireless mobile technology (i.e., wireless communications) being a prominent example. In some embodiments, while not limited to, ADCs with residue generation arrangements with digital estimation of transfer functions as disclosed herein may be included in various RF devices and systems used in wireless communications. For example, ADCs with digital estimation of transfer functions as disclosed herein may be particularly beneficial for use in fifth generation (5G) wireless communications, e.g., in millimeter-wave (mm-wave) or sub-6 GHz, applications. For illustration purposes only, one example RF device that may include any of the ADCs or residue generation arrangements with digital estimation of transfer functions as disclosed herein is shown in FIG. 9 and described below. However, in general, ADCs and residue generation arrangements with digital estimation of transfer functions as disclosed herein may be included in other RF devices and systems, all of which being within the scope of the present disclosure.

FIG. 9 provides a schematic block diagram illustrating an RF device in which an ADC or a residue generation arrangement with digital estimation of transfer functions may be implemented, according to some embodiments of the present disclosure.

In general, the RF device 900 may be any device or system that may support wireless transmission and/or reception of signals in the form of electromagnetic waves in the RF range of approximately 3 kHz to approximately 300 GHz. In some embodiments, the RF device 900 may be used for wireless communications, e.g., in a base station (BS) or a user equipment (UE) device of any suitable cellular wireless communications technology, such as GSM, WCDMA, or LTE. In a further example, the RF device 900 may be used as, or in, e.g., a BS or a UE device of a mm-wave wireless technology such as 5G wireless (i.e., high-frequency/short-wavelength spectrum, e.g., with frequencies in the range between about 20 and 60 GHz, corresponding to wavelengths in the range between about 5 and 15 millimeters). In yet another example, the RF device 900 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 900 may be used for wireless communications using Bluetooth technology (e.g., a frequency band from about 2.4 to about 2.485 GHz, corresponding to a wavelength of about 12 cm). In other embodiments, the RF device 900 may be used for transmitting and/or receiving RF signals for purposes other than communication, e.g., in an automotive radar system, or in medical applications such as MRI.

In various embodiments, the RF device 900 may be included in frequency-domain duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 9 as included in the RF device 900, but any one or more of these components may be omitted or duplicated, as suitable for the application. For example, in some embodiments, the RF device 900 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 900 may be an RF device supporting only wireless reception (e.g., an RF receiver), in which case it may include the components of the RX path, but not the components of the TX path; or the RF device 900 may be an RF device supporting only wireless transmission (e.g., an RF transmitter), in which case it may include the components of the TX path, but not the components of the RX path.

In some embodiments, some or all the components included in the RF device 900 may be attached to one or more motherboards. In some embodiments, some or all these components are fabricated on a single die, e.g., on a single system on chip (SOC) die.

Additionally, in various embodiments, the RF device 900 may not include one or more of the components illustrated in FIG. 9, but the RF device 900 may include interface circuitry for coupling to the one or more components. For example, the RF device 900 may not include a digital processing unit 908 but may include interface circuitry (e.g., connectors and supporting circuitry) to which the digital processing unit 908 may be coupled. In another example, the RF device 900 may not include a local oscillator 906, but may include interface circuitry (e.g., connectors and supporting circuitry) to which the local oscillator 906 may be coupled.

As shown in FIG. 9, the RF device 900 may include an antenna 902, a duplexer 904 (e.g., if the RF device 900 is an FDD RF device; otherwise the duplexer 904 may be omitted), a local oscillator 906, a digital processing unit 908. As also shown in FIG. 9, the RF device 900 may include an RX path that may include an RX path amplifier 912, an RX path pre-mix filter 914, a RX path mixer 916, an RX path post-mix filter 918, and an ADC 920. As further shown in FIG. 9, the RF device 900 may include a TX path that may include a TX path amplifier 922, a TX path post-mix filter 924, a TX path mixer 926, a TX path pre-mix filter 928, and a DAC 930. Still further, the RF device 900 may further include an impedance tuner 932, an RF switch 934, and control logic 936. In various embodiments, the RF device 900 may include multiple instances of any of the components shown in FIG. 9. In some embodiments, the RX path amplifier 912, the TX path amplifier 922, the duplexer 904, and the RF switch 934 may be considered to form, or be a part of, an RF front-end (FE) of the RF device 900. In some embodiments, the RX path amplifier 912, the TX path amplifier 922, the duplexer 904, and the RF switch 934 may be considered to form, or be a part of, an RF FE of the RF device 900. In some embodiments, the RX path mixer 916 and the TX path mixer 926 (possibly with their associated pre-mix and post-mix filters shown in FIG. 9) may be considered to form, or be a part of, an RF transceiver of the RF device 900 (or of an RF receiver or an RF transmitter if only RX path or TX path components, respectively, are included in the RF device 900). In some embodiments, the RF device 900 may further include one or more control logic elements/circuits, shown in FIG. 9 as control logic 936, e.g., an RF FE control interface. In some embodiments, the control logic 936 may be used to perform functions such as enhance control of complex RF system environment, support implementation of envelope tracking techniques, or reduce dissipated power within the RF device 900. In some embodiments, the control logic 936 may be used to perform, or control implementation of, digital estimation of transfer functions as described herein.

The antenna 902 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 900 is an FDD transceiver, the antenna 902 may be configured for concurrent reception and transmission of communication signals in separate, i.e., non-overlapping and non-continuous, bands of frequencies, e.g., in bands having a separation of, e.g., 20 MHz from one another. If the RF device 900 is a TDD transceiver, the antenna 902 may be configured for sequential reception and transmission of communication signals in bands of frequencies that may be the same or overlapping for TX and RX paths. In some embodiments, the RF device 900 may be a multi-band RF device, in which case the antenna 902 may be configured for concurrent reception of signals having multiple RF components in separate frequency bands and/or configured for concurrent transmission of signals having multiple RF components in separate frequency bands. In such embodiments, the antenna 902 may be a single wideband antenna or a plurality of band-specific antennas (i.e., a plurality of antennas each configured to receive and/or transmit signals in a specific band of frequencies). In some embodiments, the RF device 900 may include more than one antenna 902 to implement antenna diversity. In some such embodiments, the RF switch 934 may be deployed to switch between different antennas.

An output of the antenna 902 may be coupled to the input of the duplexer 904. The duplexer 904 may be any suitable component configured for filtering multiple signals to allow for bidirectional communication over a single path between the duplexer 904 and the antenna 902. The duplexer 904 may be configured for providing RX signals to the RX path of the RF device 900 and for receiving TX signals from the TX path of the RF device 900.

The RF device 900 may include one or more local oscillators 906, configured to provide local oscillator signals that may be used for downconversion of the RF signals received by the antenna 902 and/or upconversion of the signals to be transmitted by the antenna 902.

The RF device 900 may include the digital processing unit 908, which may include one or more processing devices. The digital processing unit 908 may be configured to perform various functions related to digital processing of the RX and/or TX signals. Examples of such functions include, but are not limited to, decimation/downsampling, error correction, digital downconversion or upconversion, DC offset cancelation, automatic gain control, etc. Although not shown in FIG. 9, in some embodiments, the RF device 900 may further include a memory device, configured to cooperate with the digital processing unit 908.

Turning to the details of the RX path that may be included in the RF device 900, the RX path amplifier 912 may include a low-noise amplifier (LNA). An input of the RX path amplifier 912 may be coupled to an antenna port (not shown) of the antenna 902, e.g., via the duplexer 904. The RX path amplifier 912 may amplify the RF signals received by the antenna 902.

An output of the RX path amplifier 912 may be coupled to an input of the RX path pre-mix filter 914, which may be a harmonic or band-pass (e.g., low-pass) filter, configured to filter received RF signals that have been amplified by the RX path amplifier 912.

An output of the RX path pre-mix filter 914 may be coupled to an input of the RX path mixer 916, also referred to as a downconverter. The RX path mixer 916 may include two inputs and one output. A first input may be configured to receive the RX signals, which may be current signals, indicative of the signals received by the antenna 902 (e.g., the first input may receive the output of the RX path pre-mix filter 914). A second input may be configured to receive local oscillator signals from one of the local oscillators 906. The RX path mixer 916 may then mix the signals received at its two inputs to generate a downconverted RX signal, provided at an output of the RX path mixer 916. As used herein, downconversion refers to a process of mixing a received RF signal with a local oscillator signal to generate a signal of a lower frequency. In particular, the TX path mixer (e.g., downconverter) 916 may be configured to generate the sum and/or the difference frequency at the output port when two input frequencies are provided at the two input ports. In some embodiments, the RF device 900 may implement a direct-conversion receiver (DCR), also known as homodyne, synchrodyne, or zero-IF receiver, in which case the RX path mixer 916 may be configured to demodulate the incoming radio signals using local oscillator signals whose frequency is identical to, or very close to the carrier frequency of the radio signal. In other embodiments, the RF device 900 may make use of downconversion of the RX signals to an intermediate frequency (IF), before downconversion to the baseband. IF may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 916 and/or the TX path mixer 926 may include several such stages of IF conversion.

Although a single RX path mixer 916 is shown in the RX path of FIG. 9, in some embodiments, the RX path mixer 916 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 902 and an in-phase component of the local oscillator signal provided by the local oscillator 906. The second RX path mixer may be configured for performing downconversion to generate a quadrature (Q) downconverted RX signal by mixing the RX signal received by the antenna 902 and a quadrature component of the local oscillator signal provided by the local oscillator 906 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 916 may, optionally, be coupled to the RX path post-mix filter 918, which may be low-pass filters. In case the RX path mixer 916 is a quadrature mixer that implements the first and second mixers as described above, the in-phase and quadrature components provided at the outputs of the first and second mixers respectively may be coupled to respective individual first and second RX path post-mix filters included in the filter 918.

The ADC 920 may be configured to convert the mixed RX signals from the RX path mixer 916 from analog to digital domain. The ADC 920 may be a quadrature ADC that, like the RX path quadrature mixer 916, may include two ADCs, configured to digitize the downconverted RX path signals separated in in-phase and quadrature components. The output of the ADC 920 may be provided to the digital processing unit 908, configured to perform various functions related to digital processing of the RX signals so that information encoded in the RX signals can be extracted. The ADC 920 may include any embodiment of the ADCs with digital estimation of transfer functions as described herein.

Turning to the details of the TX path that may be included in the RF device 900, the digital signal to later be transmitted (TX signal) by the antenna 902 may be provided, from the digital processing unit 908, to the DAC 930. Like the ADC 920, the DAC 930 may include two DACs, configured to convert, respectively, digital I- and Q-path TX signal components to analog form.

Optionally, the output of the DAC 930 may be coupled to the TX path pre-mix filter 928, which may be a band-pass (e.g., low-pass) filter (or a pair of band-pass, e.g., low-pass, filters, in case of quadrature processing) configured to filter out, from the analog TX signals output by the DAC 930, the signal components outside of the desired band. The digital TX signals may then be provided to the TX path mixer 926, which may also be referred to as an upconverter. Like the RX path mixer 916, the TX path mixer 926 may include a pair of TX path mixers, for in-phase and quadrature component mixing. Like the first and second RX path mixers that may be included in the RX path, each of the TX path mixers of the TX path mixer 926 may include two inputs and one output. A first input may receive the TX signal components, converted to the analog form by the respective DAC 930, which are to be upconverted to generate RF signals to be transmitted. The first TX path mixer may generate an in-phase (I) upconverted signal by mixing the TX signal component converted to analog form by the DAC 930 with the in-phase component of the TX path local oscillator signal provided from the local oscillator 906. In various embodiments, the local oscillator 906 may include a plurality of different local oscillators or be configured to provide different local oscillator frequencies for the mixer 916 in the RX path and the mixer 926 in the TX path. The second TX path mixer may generate a quadrature phase (Q) upconverted signal by mixing the TX signal component converted to analog form by the DAC 930 with the quadrature component of the TX path local oscillator signal. The output of the second TX path mixer may be added to the output of the first TX path mixer to create a real RF signal. A second input of each of the TX path mixers may be coupled the local oscillator 906. Thus, the second input of each of the TX path mixers 926 may receive a local oscillator signal to be used for the mixing (e.g., either a local oscillator signal at a frequency substantially the same to the RF carrier signal frequency for a direct-conversion from baseband to RF, or a frequency that is between the baseband and the RF carrier frequency if IF conversion is used).

Optionally, the RF device 900 may include the TX path post-mix filter 924, configured to filter the output of the TX path mixer 926.

The TX path amplifier 922 may include an array of power amplifiers.

In various embodiments, any of the RX path pre-mix filter 914, the RX path post-mix filter 918, the TX post-mix filter 924, and the TX pre-mix filter 928 may be implemented as RF filters. In some embodiments, an RF filter may be implemented as a plurality of RF filters, or a filter bank. A filter bank may include a plurality of RF filters that may be coupled to a switch, e. g., the RF switch 934, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 900 is, or is included in, a BS or in a UE device. In another example, such a filter bank may be programmable to suppress TX leakage on the different duplex distances.

The impedance tuner 932 may include any suitable circuitry, configured to match the input and output impedances of the different RF circuitries to minimize signal losses in the RF device 900. For example, the impedance tuner 932 may include an antenna impedance tuner. Being able to tune the impedance of the antenna 902 may be particularly advantageous because antenna's impedance is a function of the environment that the RF device 900 is in, e.g., antenna's impedance changes depending on, e.g., if the antenna is held in a hand, placed on a car roof, etc.

As described above, the RF switch 934 may be a device configured to route high-frequency signals through transmission paths, e.g., in order to selectively switch between a plurality of instances of any one of the components shown in FIG. 9, e.g., to achieve desired behavior and characteristics of the RF device 900. For example, in some embodiments, an RF switch may be used to switch between different antennas 902. In other embodiments, an RF switch may be used to switch between a plurality of RF filters (e.g., by selectively switching RF filters on and off) of the RF device 900. Typically, an RF system would include a plurality of such RF switches.

The RF device 900 provides a simplified version and, in further embodiments, other components not specifically shown in FIG. 9 may be included. For example, the RX path of the RF device 900 may include a current-to-voltage amplifier between the RX path mixer 916 and the ADC 920, which may be configured to amplify and convert the downconverted signals to voltage signals. In another example, the RX path of the RF device 900 may include a balun transformer for generating balanced signals. In yet another example, the RF device 900 may further include a clock generator, which may, e.g., include a suitable phased-lock loop (PLL), configured to receive a reference clock signal and use it to generate a different clock signal that may then be used for timing the operation of the ADC 920, the DAC 930, and/or that may also be used by the local oscillator 906 to generate the local oscillator signals to be used in the RX path or the TX path.

Example Data Processing System

FIG. 10 provides a block diagram illustrating an example data processing system 1000 that may be configured to implement, or control, at least portions of performing digital estimation of transfer functions in CT ADCs as described herein, according to some embodiments of the present disclosure. For example, the data processing system 1000 may be configured to implement or control portions of the transfer function estimation circuit 510 as described with reference to FIGS. 5-7, or any further embodiments of digital estimation of transfer functions as described herein. In another example, the data processing system 1000 may be configured to implement at least portions of the control logic 936, shown in FIG. 9.

As shown in FIG. 10, the data processing system 1000 may include at least one processor 1002, e.g., a hardware processor 1002, coupled to memory elements 1004 through a system bus 1006. As such, the data processing system may store program code within memory elements 1004. Further, the processor 1002 may execute the program code accessed from the memory elements 1004 via a system bus 1006. In one aspect, the data processing system may be implemented as a computer that is suitable for storing and/or executing program code. It should be appreciated, however, that the data processing system 1000 may be implemented in the form of any system including a processor and a memory that is capable of performing the functions described within this disclosure.

In some embodiments, the processor 1002 can execute software or an algorithm to perform the activities as discussed in the present disclosure, in particular activities related to implementing digital estimation of transfer functions as described herein. The processor 1002 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 1002 may be communicatively coupled to the memory element 1004, for example in a direct-memory access (DMA) configuration, so that the processor 1002 may read from or write to the memory elements 1004.

In general, the memory elements 1004 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 1000 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating ADCs or larger electronic devices with digital estimation of transfer functions as shown in FIGS. 1-8, can also include suitable interfaces for receiving, transmitting, and/or otherwise communicating data or information in a network environment so that they can communicate with, e.g., the data processing system 1000.

In certain example implementations, mechanisms performing digital estimation of transfer functions as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as the memory elements 1004 shown in FIG. 10, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as the processor 1002 shown in FIG. 10, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1004 may include one or more physical memory devices such as, for example, local memory 1008 and one or more bulk storage devices 1010. The local memory may refer to RAM or other non-persistent memory device(s) generally used during actual execution of the program code. A bulk storage device may be implemented as a hard drive or other persistent data storage device. The processing system 1000 may also include one or more cache memories (not shown) that provide temporary storage of at least some program code in order to reduce the number of times program code must be retrieved from the bulk storage device 1010 during execution.

As shown in FIG. 10, the memory elements 1004 may store an application 1018. In various embodiments, the application 1018 may be stored in the local memory 1008, the one or more bulk storage devices 1010, or apart from the local memory and the bulk storage devices. It should be appreciated that the data processing system 1000 may further execute an operating system (not shown in FIG. 10) that can facilitate execution of the application 1018. The application 1018, being implemented in the form of executable program code, can be executed by the data processing system 1000, e.g., by the processor 1002. Responsive to executing the application, the data processing system 1000 may be configured to perform one or more operations or method steps described herein.

Input/output (I/O) devices depicted as an input device 1012 and an output device 1014, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 1014 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 1014. Input and/or output devices 1012, 1014 may be coupled to the data processing system either directly or through intervening I/O controllers.

In an embodiment, the input and the output devices may be implemented as a combined input/output device (illustrated in FIG. 10 with a dashed line surrounding the input device 1012 and the output device 1014). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 1016 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1000, and a data transmitter for transmitting data from the data processing system 1000 to said systems, devices and/or networks. Modems, cable modems, and Ethernet cards are examples of different types of network adapter that may be used with the data processing system 1000.

Select Examples

The following paragraphs provide various select examples of the embodiments disclosed herein.

Example 1 provides an electronic device that includes a delay circuit, a quantizer, a feedforward DAC, a combiner, a transfer function (TF) estimation circuit, and a digital reconstruction circuit. The delay circuit is configured to generate a delay circuit output signal by applying a delay to an analog input signal. The quantizer is configured to generate a quantizer output signal based on the analog input signal. The feedforward DAC is configured to generate a feedforward DAC output signal based on the quantizer output signal. The combiner is configured to generate a combiner output signal based on the delay circuit output signal, the feedforward DAC output signal, and a test signal, where a signal indicative of the combiner output is to be provided to a backend ADC, configured to generate a backend ADC output signal based on the combiner output signal. The TF estimation circuit is configured to generate an estimate ($\hat{H}(z)$) of a TF ($H(z)$) undergone by signals between an input of the feedforward DAC and an output of the backend ADC by generating a first cross-correlation output by cross-correlating digital versions of a signal based on the test signal and a signal based on the backend ADC output signal, generating a second cross-correlation output by cross-correlating digital versions of the signal based on the test signal and a signal based on the quantizer output signal, and generating the estimate of the TF based on the first and second cross-correlation outputs. The digital reconstruction circuit is configured to generate an ADC output signal based on the backend ADC output signal, the quantizer output signal, and the estimate of the TF.

Example 2 provides the electronic device according to example 1, where the first cross-correlation output includes a time-domain impulse response of a first TF, the second cross-correlation output includes a time-domain impulse response of a second TF, and where generating the estimate of the TF includes performing a deconvolution based on the time-domain impulse response of the first TF and the time-domain impulse response of the second TF.

Example 3 provides the electronic device according to example 2, where the first TF is $H(z)(1-H_{leak}(z))$, where $H(z)$ is the TF and $H_{leak}(z)$ is an estimate of a transfer function indicative of a portion of the test signal leaking into the quantizer output signal (which corrupts the $H(z)$ estimation), and the second TF is $H_{leak}(z)$.

Example 4 provides the electronic device according to examples 2 or 3, where generating the estimate of the TF includes processing the first and second cross-correlation outputs in a manner that is equivalent to dividing the first TF by a transfer function based on the second TF.

Example 5 provides the electronic device according to any one of examples 1-4, where the digital reconstruction circuit includes a TF application circuit, configured to generate a TF application circuit output signal by applying the estimate of the TF to a signal based on the quantizer output signal, and a further combiner, configured to generate the ADC output signal by combining a signal based on the TF application circuit output signal and a signal based on the backend ADC output signal.

Example 6 provides the electronic device according to any one of examples 1-4, where the digital reconstruction circuit includes a TF application circuit, configured to generate a TF application circuit output signal by applying an inverse of the estimate of the TF to a signal based on the backend ADC output signal, and a further combiner, configured to generate the ADC output signal by combining a signal based on the TF application circuit output signal and a signal based on the quantizer output signal.

The results of generating the ADC output signal according to examples 5 and 6 may be substantially the same, except, possibly, for some scaling.

Example 7 provides the electronic device according to any one of the preceding examples, further including a digital test signal combiner, configured to generate a digital test signal combiner output signal based on the quantizer output signal and a digital version of the test signal, where the digital reconstruction circuit is configured to generate the ADC output signal based on the quantizer output signal by being configured to generate the ADC output signal based on the digital test signal combiner output signal. For example, for the ADC output signal generation according to example 5, the "signal based on the quantizer output signal" (i.e., the signal to which the TF application circuit applies the estimate of the TF according to example 5) may be a signal based on the digital test signal combiner output signal. In another example, for the ADC output signal generation according to example 6, the "signal based on the quantizer output signal" (i.e., the signal which the further combiner combines with the signal based on the TF application circuit output signal according to example 6) may be a signal based on the digital test signal combiner output signal.

Example 8 provides the electronic device according to any one of the preceding examples, where the test signal is a pseudo-random bit sequence or a dither signal.

Example 9 provides the electronic device according to any one of the preceding examples, further including a test signal generator, configured to generate the test signal in a digital form, and a test signal generator DAC, configured to generate a test signal generator DAC output signal (i.e., the test signal in an analog form) based on the digital form of the test signal, where the combiner is configured to generate the combiner output signal based on the test signal by generating the combiner output signal based on the test signal generator DAC output signal (i.e., the test signal in an analog form).

Example 10 provides the electronic device according to any one of the preceding examples, where the electronic device is an ADC, the delay circuit, the quantizer, the feedforward DAC, the combiner, and the digital reconstruction circuit are included in a first stage of the ADC, and the ADC further includes a second stage, where an analog input signal for the second stage is based on the combiner output signal of the first stage, and where the digital reconstruction circuit of the first stage is configured to generate the ADC output further based on an output of a digital reconstruction circuit of the second stage.

Example 11 provides the electronic device according to any one of the preceding examples, where the electronic device is a residue generation pipelined ADC.

Example 12 provides a TF estimation circuit, configured to generate an estimate of a TF undergone by signals between an input of a feedforward DAC of a feedforward path of a CT stage of an ADC and an output of a backend ADC of the ADC. The TF estimation circuit includes one or more circuits configured to generate a first cross-correlation output by cross-correlating digital versions of a signal based on a test signal provided to the CT stage of the ADC and a signal based on a backend ADC output signal generated by the backend ADC, generate a second cross-correlation output by cross-correlating digital versions of the signal based on the test signal and a signal based on a quantizer output signal generated by a quantizer of the feedforward path of the CT stage of the ADC, and generate the estimate of the TF based on the first and second cross-correlation outputs.

Example 13 provides the TF estimation circuit according to example 12, where the first cross-correlation output includes a time-domain impulse response of a first TF, the second cross-correlation output includes a time-domain impulse response of a second TF, and where generating the estimate of the TF based on the first and second cross-correlation outputs includes generating the estimate of the TF based on the first and second TFs.

Example 14 provides the TF estimation circuit according to example 13, where generating the estimate of the TF includes performing a deconvolution based on the time-domain impulse response of the first TF and the time-domain impulse response of the second TF.

Example 15 provides the TF estimation circuit according to examples 13 or 14, where generating the estimate of the TF includes processing the first and second cross-correlation outputs in a manner that is equivalent to dividing the first TF by a transfer function that is based on the second TF.

Example 16 provides the TF estimation circuit according to any one of examples 12-15, where the one or more circuits of the TF estimation circuit include a cross-correlator configured to generate the first and second cross-correlation outputs sequentially.

Example 17 provides the TF estimation circuit according to example 16, where the cross-correlator is configured to receive the signal based on the test signal, and where the TF estimation circuit further includes a switching arrangement, configured to operate in a first mode or in a second mode, where, in the first mode, the switching arrangement is configured to provide to the cross-correlator the signal based on the backend ADC output signal (to enable the cross-correlator to generate the first cross-correlation output), and, in the second mode, the switching arrangement is configured to provide to the cross-correlator the signal based on the quantizer output signal (to enable the cross-correlator to generate the second cross-correlation output).

Example 18 provides the TF estimation circuit according to example 17, where the switching arrangement includes a multiplexer.

Example 19 provides a method for generating an estimate of a TF between an input of a feedforward DAC of a feedforward path of a CT stage of an ADC and an output of a backend ADC of the ADC. The method includes cross-correlating digital versions of a signal based on a test signal provided to the CT stage of the ADC and a signal based on a backend ADC output signal generated by the backend ADC, cross-correlating digital versions of the signal based on the test signal and a signal based on a quantizer output signal generated by a quantizer of the feedforward path of the CT stage of the ADC, and generating the estimate of the TF based on an output of cross-correlating the signal based on the test signal and the signal based on the backend ADC output signal, and an output of cross-correlating the signal based on the test signal and the quantizer output signal.

Example 20 provides the method according to example 19, where the output of cross-correlating the signal based on the test signal and the signal based on the backend ADC output signal is indicative of a first TF that is a product of the TF and a function based on a TF indicative of a portion of the test signal in the quantizer output signal, and the output of cross-correlating the signal based on the test signal and the quantizer output signal is indicative of a second TF that is substantially same as the TF indicative of the portion of the test signal in the quantizer output signal.

Some further examples may include electronic devices, ADCs or ADC arrangements, e.g., residue generation ADCs, that include the TF estimation circuit according to any one of examples 12-18 and/or that are configured to perform the method according to any one of examples 19-20. Another further example may include a computer program product or a computer-readable storage medium, including instructions which, when executed on a processor, are configured to perform the method according to any one of examples 19-20.

OTHER IMPLEMENTATION NOTES, VARIATIONS, AND APPLICATIONS

The described techniques for generating residue signals to be provided to subsequent stages of an ADC using digital estimation of transfer functions may be particularly suitable for high-speed, CT, high precision applications where residue-generating ADCs are used. While embodiments of the present disclosure were described above with references to exemplary implementations as shown in FIGS. 1-10, a person skilled in the art will realize that the various teachings described above are applicable to a large variety of other implementations. For example, some applications which can greatly benefit from implementing digital estimation of transfer functions as described herein include instrumentation, testing, spectral analyzers, military purposes, radar, wired or wireless communications, mobile telephones (especially because standards continue to push for higher speed communications), and base stations.

In the discussions of the embodiments above, components of a system, such as inductors, capacitors, filters, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to providing residue generation arrangements with digital estimation of transfer functions as described herein.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions, all of which may be provided on a single chip or a single substrate. Other embodiments may include a multichip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-10) have only been offered for purposes of example and teaching only. Such information may be varied considerably without departing from the spirit of the present disclosure. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular component arrangements. Various modifications and changes may be made to such embodiments without departing from the scope of the present disclosure. The description and drawings are, accordingly, to be regarded in an illustrative rather than in a restrictive sense.

The invention claimed is:

1. An electronic device, comprising:
a delay circuit, configured to generate a delay circuit output signal by applying a delay to an analog input signal;
a quantizer, configured to generate a quantizer output signal based on the analog input signal;
a feedforward DAC, configured to generate a feedforward DAC output signal based on the quantizer output signal;
a combiner, configured to generate a combiner output signal based on the delay circuit output signal, the feedforward DAC output signal, and a test signal, where a signal indicative of the combiner output is to be provided to a backend analog-to-digital converter (ADC), configured to generate a backend ADC output signal based on the combiner output signal;
a transfer function (TF) estimation circuit, configured to generate an estimate of a TF (H(z)) undergone by signals between an input of the feedforward DAC and an output of the backend ADC by:
generating a first cross-correlation output by cross-correlating a signal based on the test signal and a signal based on the backend ADC output signal,
generating a second cross-correlation output by cross-correlating the signal based on the test signal and a signal based on the quantizer output signal, and
generating the estimate of the TF based on the first and second cross-correlation outputs; and
a digital reconstruction circuit, configured to generate an ADC output signal based on the backend ADC output signal, the quantizer output signal, and the estimate of the TF.

2. The electronic device according to claim 1, wherein:
the first cross-correlation output includes a time-domain impulse response of a first TF,
the second cross-correlation output includes a time-domain impulse response of a second TF, and
generating the estimate of the TF includes performing a deconvolution based on the time-domain impulse response of the first TF and the time-domain impulse response of the second TF.

3. The electronic device according to claim 2, wherein:
the first TF is $H(z)(1-H_{leak}(z))$, where $H(z)$ is the TF and $H_{leak}(z)$ is an estimate of a transfer function indicative of a portion of the test signal leaking into the quantizer output signal, and
the second TF is $H_{leak}(z)$.

4. The electronic device according to claim 2, wherein generating the estimate of the TF includes processing the first and second cross-correlation outputs in a manner that is equivalent to dividing the first TF by a transfer function based on the second TF.

5. The electronic device according to claim 1, wherein the digital reconstruction circuit includes:
a TF application circuit, configured to generate a TF application circuit output signal by applying the estimate of the TF to a signal based on the quantizer output signal, and
a further combiner, configured to generate the ADC output signal by combining a signal based on the TF application circuit output signal and a signal based on the backend ADC output signal.

6. The electronic device according to claim 1, wherein the digital reconstruction circuit includes:
a TF application circuit, configured to generate a TF application circuit output signal by applying an inverse of the estimate of the TF to a signal based on the backend ADC output signal, and
a further combiner, configured to generate the ADC output signal by combining a signal based on the TF application circuit output signal and a signal based on the quantizer output signal.

7. The electronic device according to claim 1, further comprising a digital test signal combiner, configured to generate a digital test signal combiner output signal based on the quantizer output signal and the test signal, wherein the digital reconstruction circuit is configured to generate the ADC output signal based on the quantizer output signal by being configured to generate the ADC output signal based on the digital test signal combiner output signal.

8. The electronic device according to claim 1, wherein the test signal is a pseudo-random bit sequence or a dither signal.

9. The electronic device according to claim 1, further comprising:
a test signal generator, configured to generate the test signal in a digital form, and
a test signal generator DAC, configured to generate a test signal generator DAC output signal based on the digital form of the test signal,
wherein the combiner is configured to generate the combiner output signal based on the test signal by generating the combiner output signal based on the test signal generator DAC output signal.

10. The electronic device according to claim 1, wherein:
the electronic device is an ADC,
the delay circuit, the quantizer, the feedforward DAC, the combiner, and the digital reconstruction circuit are included in a first stage of the ADC, and
the ADC further includes a second stage, where an analog input signal for the second stage is based on the combiner output signal of the first stage, and where the digital reconstruction circuit of the first stage is configured to generate the ADC output further based on an output of a digital reconstruction circuit of the second stage.

11. The electronic device according to claim 1, wherein the electronic device is a residue generation pipelined ADC.

12. A transfer function (TF) estimation circuit, configured to generate an estimate of a TF between an input of a feedforward digital to-analog-converter (DAC) of a feedforward path of a continuous-time (CT) stage of an analog-to-digital converter (ADC) and an output of a backend ADC of the ADC, the TF estimation circuit comprising one or more circuits configured to:
  generate a first cross-correlation output by cross-correlating a signal based on a test signal provided to the CT stage of the ADC and a signal based on a backend ADC output signal generated by the backend ADC,
  generate a second cross-correlation output by cross-correlating the signal based on the test signal and a signal based on a quantizer output signal generated by a quantizer of the feedforward path of the CT stage of the ADC, and
  generate the estimate of the TF based on the first and second cross-correlation outputs.

13. The TF estimation circuit according to claim 12, wherein:
  the first cross-correlation output includes a time-domain impulse response of a first TF,
  the second cross-correlation output includes a time-domain impulse response of a second TF, and
  generating the estimate of the TF based on the first and second cross-correlation outputs includes generating the estimate of the TF based on the first and second TFs.

14. The TF estimation circuit according to claim 13, wherein generating the estimate of the TF includes performing a deconvolution based on the time-domain impulse response of the first TF and the time-domain impulse response of the second TF.

15. The TF estimation circuit according to claim 13, wherein generating the estimate of the TF includes processing the first and second cross-correlation outputs in a manner that is equivalent to dividing the first TF by a transfer function that is based on the second TF.

16. The TF estimation circuit according to claim 12, wherein the one or more circuits of the TF estimation circuit include a cross-correlator configured to generate the first and second cross-correlation outputs sequentially.

17. The TF estimation circuit according to claim 16, wherein the cross-correlator is configured to receive the signal based on the test signal, and wherein the TF estimation circuit further includes a switching arrangement, configured to operate in a first mode or in a second mode, wherein:
  in the first mode, the switching arrangement is configured to provide to the cross-correlator the signal based on the backend ADC output signal, and
  in the second mode, the switching arrangement is configured to provide to the cross-correlator the signal based on the quantizer output signal.

18. The TF estimation circuit according to claim 17, wherein the switching arrangement includes a multiplexer.

19. A method for generating an estimate of a transfer function (TF) between an input of a feedforward digital to-analog-converter (DAC) of a feedforward path of a continuous-time (CT) stage of an analog-to-digital converter (ADC) and an output of a backend ADC of the ADC, the method comprising:
  cross-correlating a signal based on a test signal provided to the CT stage of the ADC and a signal based on a backend ADC output signal generated by the backend ADC,
  cross-correlating the signal based on the test signal and a signal based on a quantizer output signal generated by a quantizer of the feedforward path of the CT stage of the ADC, and
  generating the estimate of the TF based on an output of cross-correlating the signal based on the test signal and the signal based on the backend ADC output signal, and an output of cross-correlating the signal based on the test signal and the quantizer output signal.

20. The method according to claim 19, wherein:
  the output of cross-correlating the signal based on the test signal and the signal based on the backend ADC output signal is indicative of a first TF that is a product of the TF and a function based on a TF indicative of a portion of the test signal in the quantizer output signal, and
  the output of cross-correlating the signal based on the test signal and the quantizer output signal is indicative of a second TF that is substantially same as the TF indicative of the portion of the test signal in the quantizer output signal.

* * * * *